United States Patent
Gonzalez et al.

(10) Patent No.: US 9,769,940 B1
(45) Date of Patent: Sep. 19, 2017

(54) SYSTEMS AND APPARATUS FOR MOUNTING A WIRELESS ACCESS POINT

(71) Applicant: Juniper Networks, Inc., Sullyvale, CA (US)

(72) Inventors: Adolpho Gonzalez, Fresno, CA (US); Brian Ray, Livermore, CA (US); Jeffrey L. Pochop, Jr., Los Gatos, CA (US); Paul Briel, Campbell, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/194,141

(22) Filed: Jun. 27, 2016

Related U.S. Application Data

(63) Continuation of application No. 13/538,050, filed on Jun. 29, 2012, now Pat. No. 9,404,615.

(51) Int. Cl.
*F21V 21/00* (2006.01)
*H05K 5/02* (2006.01)
*F16M 13/02* (2006.01)
*F16M 11/00* (2006.01)
*H04W 88/08* (2009.01)

(52) U.S. Cl.
CPC ........... *H05K 5/0208* (2013.01); *F16M 13/02* (2013.01); *H05K 5/0204* (2013.01); *H04W 88/08* (2013.01)

(58) Field of Classification Search
CPC .... H05K 5/0204; F16M 11/04; F16M 11/041; F16M 11/10; F16M 13/02; F16M 11/16; A47K 10/10; G06F 1/18

USPC ........ 248/686, 27.3, 220.21, 220.22, 221.11, 248/222.12, 224.51, 224.61, 225.21, 248/225.11, 224.8
See application file for complete search history.

(56) References Cited

U.S. PATENT DOCUMENTS

| | | | | |
|---|---|---|---|---|
| 4,587,695 A | | 5/1986 | Jensen | |
| 5,563,766 A | * | 10/1996 | Long | H02B 1/04 248/224.7 |
| 5,850,996 A | * | 12/1998 | Liang | A45F 5/02 224/197 |
| 6,007,136 A | * | 12/1999 | Zittwitz | B60J 3/0221 24/295 |

(Continued)

OTHER PUBLICATIONS

Office Action for U.S. Appl. No. 13/538,050, mailed Oct. 8, 2013.
(Continued)

*Primary Examiner* — Muhammad Ijaz
(74) *Attorney, Agent, or Firm* — Cooley LLP

(57) ABSTRACT

A housing includes a mount projection defining a first notch, a second notch, and a recessed wall. At least a portion of the recessed wall defines a substantially conical cross-sectional shape between a maximum width and a length from a leading portion to a line associated with the maximum width. The mount projection is configured to complimentarily mate to a bracket defining a recessed wall with a maximum width, corresponding to the maximum width of the mount projection, and a length, corresponding to the length of the mount projection, from a leading portion to a line associated with the maximum width. The mount projection is releasably retained within an opening of the bracket when a first projection and a second projection of the bracket are disposed within the first notch and the second notch, respectively, of the mount projection.

19 Claims, 34 Drawing Sheets

(56) References Cited

U.S. PATENT DOCUMENTS

| | | | | |
|---|---|---|---|---|
| 6,286,737 | B1* | 9/2001 | Whitley | H04M 1/04 224/196 |
| 6,371,424 | B1* | 4/2002 | Shaw | F16M 11/02 248/187.1 |
| 6,481,679 | B1* | 11/2002 | Bennett | A61G 13/101 248/223.41 |
| 6,799,743 | B2* | 10/2004 | Sawayanagi | B60J 3/0217 248/224.8 |
| 6,976,883 | B2* | 12/2005 | Andres | G08B 17/00 439/638 |
| 7,077,372 | B2* | 7/2006 | Moran | A61B 19/54 24/573.11 |
| 7,318,571 | B2* | 1/2008 | Linssen | F21S 48/1122 248/222.12 |
| 7,490,800 | B2* | 2/2009 | Tu | H05K 5/0204 248/224.8 |
| 7,594,823 | B2* | 9/2009 | Moscovitch | B60R 11/0235 248/121 |
| 7,731,140 | B2 | 6/2010 | Carnevali | |
| 7,837,164 | B1* | 11/2010 | Getgood | E04H 15/64 135/120.3 |
| 8,020,821 | B2* | 9/2011 | Chen | F16M 11/16 248/220.22 |
| 8,104,652 | B2* | 1/2012 | Yeh | B62J 9/006 224/427 |
| 8,146,227 | B2* | 4/2012 | Schmitz | B60R 5/003 224/486 |
| 8,177,178 | B2* | 5/2012 | Carnevali | F16M 11/04 24/618 |
| 8,299,978 | B2* | 10/2012 | Gates | H01Q 1/007 343/725 |
| 8,453,983 | B2* | 6/2013 | Huang | F16M 11/041 248/222.12 |
| 2006/0065804 | A1* | 3/2006 | Burriel | F16M 11/00 248/316.1 |
| 2007/0097617 | A1* | 5/2007 | Searby | F16M 11/04 361/679.4 |
| 2007/0097618 | A1* | 5/2007 | Searby | F16M 11/04 361/679.4 |
| 2008/0105803 | A1* | 5/2008 | Tu | H05K 5/0204 248/220.22 |
| 2009/0193632 | A1* | 8/2009 | Yeh | B62J 9/006 24/581.1 |
| 2011/0146163 | A1* | 6/2011 | Naroditsky | H05K 5/0204 52/27 |
| 2013/0081457 | A1* | 4/2013 | Wilson | G01M 17/02 73/146 |

OTHER PUBLICATIONS

Final Office Action for U.S. Appl. No. 13/538,050, mailed Mar. 26, 2014.
Office Action for U.S. Appl. No. 13/538,050, mailed Feb. 13, 2015.
Final Office Action for U.S. Appl. No. 13/538,050, mailed Jun. 25, 2015.

\* cited by examiner

SYSTEMS AND APPARATUS FOR MOUNTING A WIRELESS ACCESS POINT

CROSS-REFERENCE TO RELATED APPLICATIONS

This application claims priority to and is a continuation of U.S. patent application Ser. No. 13/538,050, filed Jun. 29, 2012 (now U.S. Pat. No. 9,404,615), and entitled "Systems and Apparatus for Mounting a Wireless Access Point," which is incorporated herein by reference in its entirety.

BACKGROUND

Some embodiments described herein relate to mounting devices. More particularly, some embodiments described herein relate to systems and apparatus for mounting a wireless access point.

More and more networks are established via wireless communication. In some instances, local area networks (LAN) can include a wireless access point, such as a router, configured to connect wireless communication devices with other portions of a wireless local area network. In such instances, it can be desirable to limit physical access to a wireless access point (WAP) to reduce the likelihood of the WAP being tampered with and/or stolen. Known systems and apparatus for mounting a WAP often fall short of facilitating a secure method of mounting a WAP while maintaining a given level of ease with which to mount the WAP. For example, in some known systems, mounting apparatus include multiple parts configured to be assembled by multiple different tools (e.g., various screwdrivers, wrenches, pliers, or the like). In some known systems, installation professionals spend a relatively large amount of time installing mounting apparatus, thereby increasing the overall cost of implementation of a WAP. In some known systems, mounting apparatus lack sufficient security features, thereby increasing the likelihood of theft.

Thus, a need exists for improved systems and apparatus for mounting a wireless access point.

SUMMARY

Systems and apparatus for mounting a wireless access point are described herein. In some embodiments, a housing includes a mount projection defining a first notch, a second notch, and a recessed wall. At least a portion of the recessed wall defines a substantially conical cross-sectional shape between a maximum width and a length from a leading portion to a line associated with the maximum width. The mount projection is configured to complimentarily mate to a bracket defining a recessed wall with a maximum width, corresponding to the maximum width of the mount projection, and a length, corresponding to the length of the mount projection, from a leading portion to a line associated with the maximum width. The mount projection is releasably retained within an opening of the bracket when a first projection and a second projection of the bracket are disposed within the first notch and the second notch, respectively, of the mount projection.

DETAILED DESCRIPTION

Systems and apparatus for mounting a wireless access point are described herein. In some embodiments, a housing includes a mount projection defining a first notch, a second notch, and a recessed wall. At least a portion of the recessed wall defines a substantially conical cross-sectional shape between a maximum width and a length from a leading portion to a line associated with the maximum width. The mount projection is configured to complimentarily mate to a bracket defining a recessed wall with a maximum width, corresponding to the maximum width of the mount projection, and a length, corresponding to the length of the mount projection, from a leading portion to a line associated with the maximum width. The mount projection is releasably retained within an opening of the bracket when a first projection and a second projection of the bracket are disposed within the first notch and the second notch, respectively, of the mount projection.

In some embodiments, the bracket includes a first latch and a second latch and includes a recessed wall. At least a portion of the recessed wall defines a substantially conical cross-sectional shape between a maximum width and a length from a leading portion to a line associated with the maximum width. The bracket is configured to complimentarily mate with a mount projection of a housing. The mount projection has a substantially conical cross-sectional shape and defines a first notch and a second notch. The bracket is configured to releasably retain the housing when an end portion of the first latch is disposed within the first notch of the mount projection and an end portion of the second latch is disposed within the second notch of the mount projection.

In some embodiments, the bracket includes an actuator coupled to a first latch and a second latch. The bracket is configured to complimentarily mate with a mount projection of a housing defining a first notch and a second notch. The actuator is configured to move between a first position and a second position. With the actuator in the first position, the bracket is configured to releasably retain the housing such that an end portion of the first latch is disposed within the first notch of the mount projection and an end portion of the second latch is disposed within the second notch of the mount projection. With the actuator in the second position, the end portion of the first latch is substantially not disposed within the first notch and the end portion of the second latch is substantially not disposed within the second notch.

Figure 1:
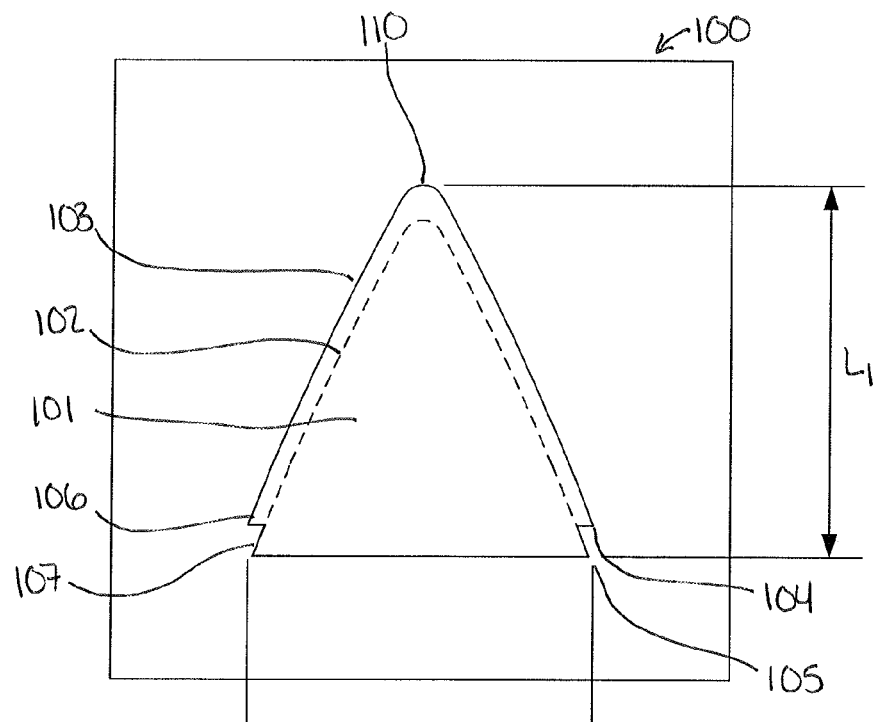
FIG. 1 is a schematic illustration of a housing, according to an embodiment.

FIG. 1 is a schematic illustration of a portion of a housing 100 included in, for example, a wireless access point (WAP). The housing 100 includes a mount projection 101 configured to extend from an outer surface of the housing 100. The mount projection 101 includes a recessed wall 102 and a lip 103 configured to extend from the recessed wall 102. Similarly stated, the recessed wall 102 of the mount projection 101 is disposed between the outer surface of the housing 100 and the lip 103.

The mount projection 101 includes a first end portion 104, a second end portion 106, and a leading portion 110. More specifically, the mount projection 101 has a maximum width $W_1$ defined between a point of the first end portion 104 and a point of the second end portion 106. The mount projection 101 also has a length $L_1$ between the leading portion 110 and a line (not shown in FIG. 1) associated with the maximum width $W_1$. In this manner, the recessed wall 102 is configured to extend, substantially continuously, between the first end portion 104 and the second end portion 106 such that at least a portion of the mount projection 101 defines a substantially conical cross-sectional shape. Similarly stated, at least a portion of the recessed wall 102 defines a substantially conical cross-sectional shape between the line associated with the maximum width $W_1$ and the leading portion 110.

While shown and described with respect to FIG. 1 as having a substantially conical cross-sectional shape, in some embodiments, a portion of the mount projection 101 and/or the recessed wall 102 can define any suitable cross-sectional shape. For example, in some embodiments, the recessed wall 102 can define a substantially triangular shape such that a portion of the recessed wall 102 is substantially straight (e.g., non-curved between an end portion and a leading portion). In some embodiments, the mount projection 101 and/or the recessed wall can have a substantially pyramidal shape. In still other embodiments, the mount projection 101 and/or the recessed wall can be substantially rounded.

As described above, the lip 103 of the mount projection 101 is configured to extend from the surface of the recessed wall 102. The lip 103 can be any suitable shape, size, or configuration. For example, in some embodiments, the lip 103 extends substantially uniformly from the recessed wall 102 including a substantially consistent width and height between the first end portion 104 and the second end portion 106 of the mount projection 101. The lip 103 defines a first notch 105 disposed at the first end portion 104 of the mount projection 101, and a second notch 107 disposed at the second end portion 105 of the mount projection 101. In this manner, the housing 100 is configured to be coupled to a bracket such that a surface of the lip 103 defining the first notch 105 and a surface of the lip 103 defining the second notch 107 are engage a portion of a bracket, as further described herein.

Figure 2:
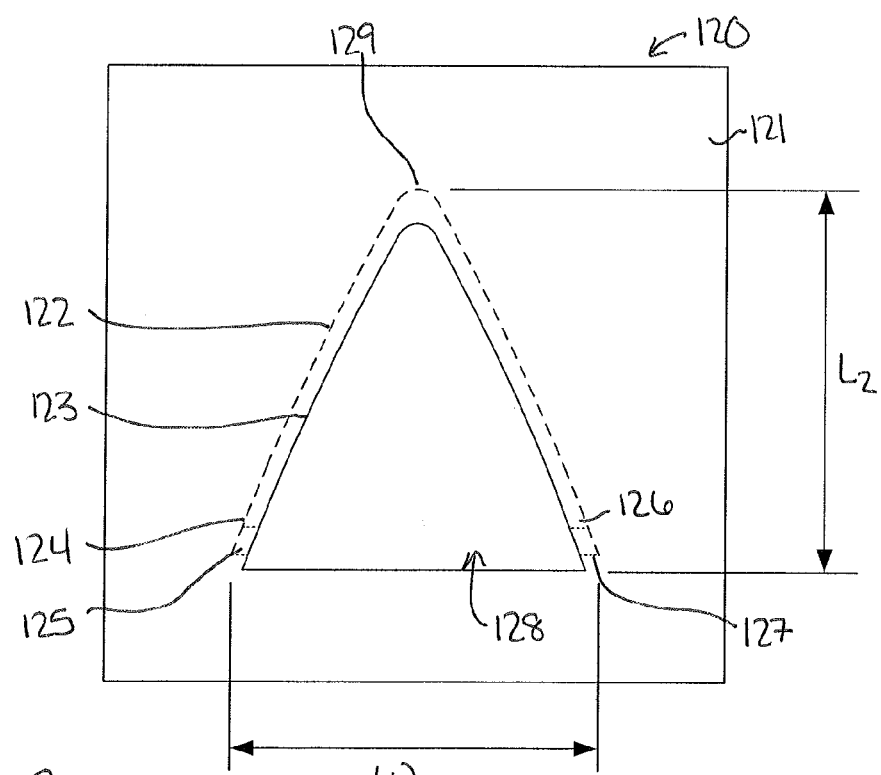
FIG. 2 is a schematic illustration of a bracket, according to an embodiment.

For example, FIG. 2 is a schematic illustration of a portion of a bracket 120 configured to be coupled to the housing 100. The bracket 120 includes a base 121 that defines an opening 128 configured to receive a portion of the housing 100. More specifically, the base 121 includes a recessed wall 122 and a lip 123 that define the opening 128. The recessed wall 122 includes a first end portion 124, a second end portion 126, and a leading portion 129. Moreover, the recessed wall 122 has a maximum width $W_2$ defined between a point of the first end portion 124 and a point of the second end portion 126. The recessed wall 122 also has a length $L_2$ between the leading portion 129 and a line (not shown in FIG. 2)

associated with the maximum width $W_2$. In this manner, the recessed wall 122 is configured to extend, substantially continuously, between the first end portion 124 and the second end portion 126 such that at least a portion of the recessed wall 122 defines a substantially conical cross-sectional shape. Furthermore, the width $W_2$ and the length $L_2$ of the recessed wall 122 are configured to substantially correspond to the width $W_1$ and the length $L_1$ of the mount projection 101, as further described herein.

The recessed wall 122 is further configured to include a first projection 125 and a second projection 127. The first projection 125 is configured to extend from a surface of the recessed wall 122 disposed at the first end portion 124, and the second projection 127 is configured to extend from a surface of the recessed wall 122 disposed at the second end portion 126. In this manner, the opening 128 defined by the recessed wall 122 and the lip 123 of bracket 120 is configured to receive at least a portion of the mount projection 101 of the housing 100.

Figure 3:
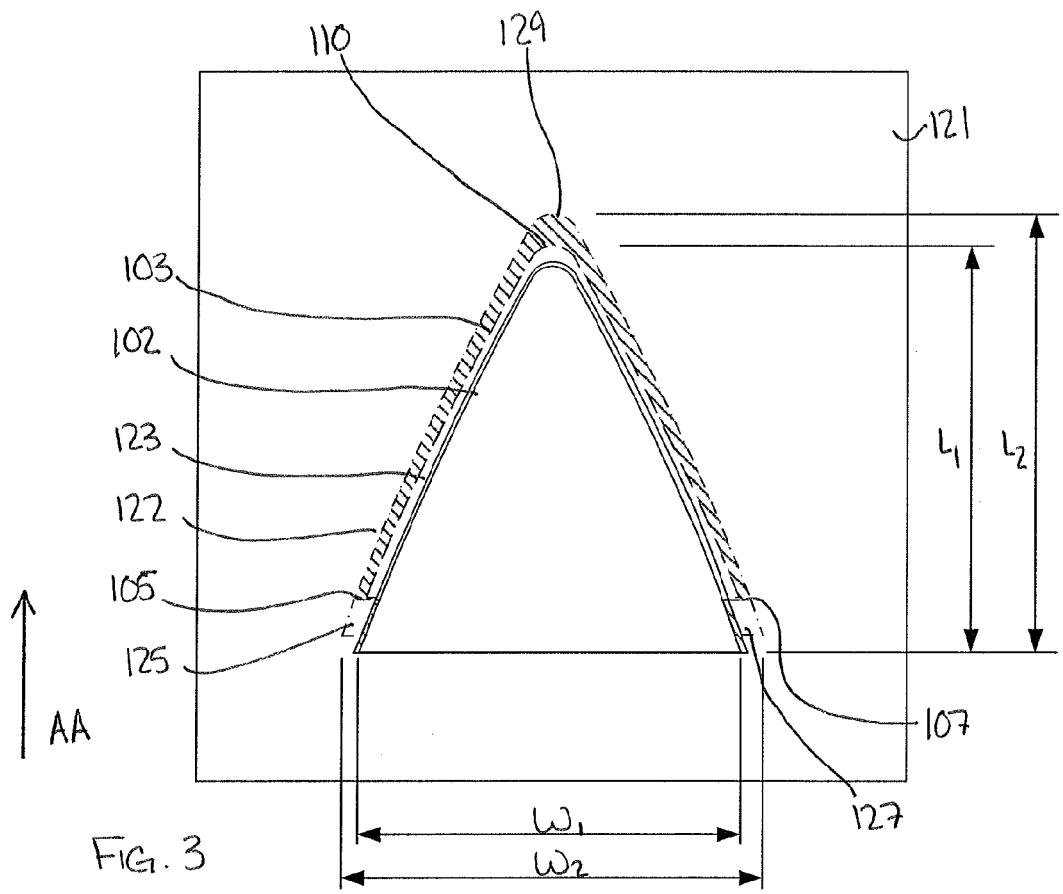
FIGS. 3 and 4 are schematic illustrations of the housing of FIG. 1 complimentarily mated with the bracket of FIG. 2.
Figure 4:
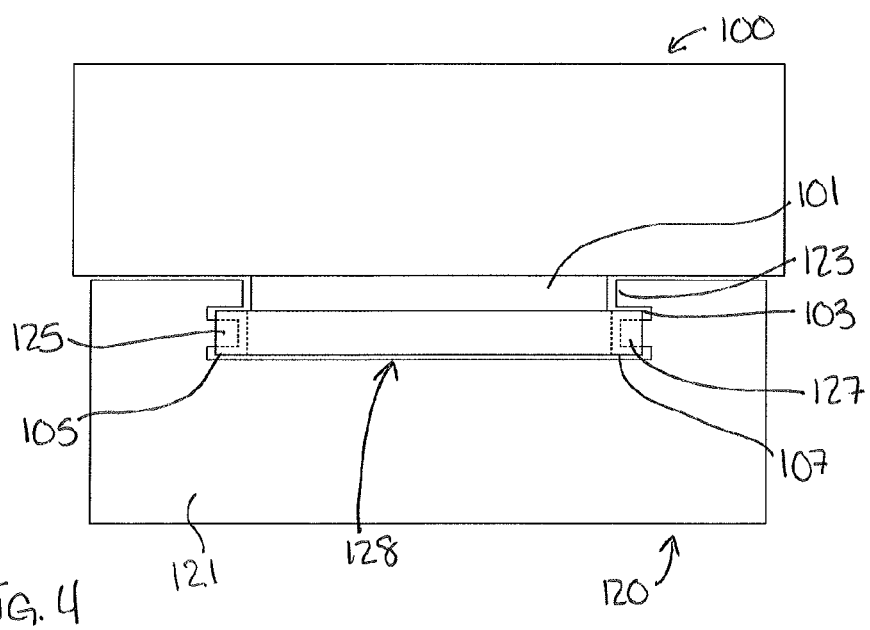

For example, as shown in FIGS. 3 and 4, the mount projection 101 of the housing 100 can be disposed within the opening 128 such that the lip 103 of the mount projection 101 is disposed within a space defined, at least in part, by the recessed wall 122, the lip 123, and a surface of the base 121 of the bracket 120. The arrangement of the recessed wall 102 and the lip 103 of the mount projection 101 and the arrangement of the recessed wall 122 and the lip 123 of the bracket 120 are such that the mount projection 101 enters the opening 128 in a given direction, substantially normal to the line defined by the maximum width $W_2$ of the bracket 120, as indicated by the arrow AA in FIG. 3. Similarly stated, the recessed wall 122 of the bracket 120 is configured such that the opening 128 is open ended between the first end portion 124 and the second end portion 126 and can receive the mount projection 101. Said another way, the recessed wall 122 and the lip 123 of the bracket 120 substantially limit the insertion of the mount projection 101 to the direction of the arrow AA.

As described above, the width $W_2$ and the length $L_2$ defined by the recessed wall 122 of the bracket 120 substantially correspond to the width $W_1$ and the length $L_1$ of the mount projection 101, respectively. More specifically, the width $W_2$ and the length $L_2$ of the recessed wall 122 are slightly greater than the width $W_1$ and length $L_1$ of the mount projection 101 such that the portion of the mount projection 101 can be inserted into the opening 128 defined by the recessed wall 122 of the bracket 120. For example, in some embodiments, the width $W_2$ and the length $L_2$ can be approximately 1/16 of an inch larger than the width $W_1$ and length $L_1$. Similarly stated, in some embodiments, the mount projection 128 can be inserted into the opening 128 such that a tolerance of 1/16 of an inch exists between the width $W_1$ and the length $L_1$ of the mount projection 101 and the width $W_2$ and the length $L_2$ of the recessed wall 122. In other embodiments, the tolerance can be greater than 1/16 of an inch. In still other embodiments, the tolerance can be less than 1/16 of an inch.

As shown in FIG. 4, when the mount projection 101 is disposed within the opening 128 of the bracket 120, the first notch 105 and the second notch 107 defined by the lip 103 of the mount projection 101 can receive the first projection 125 and the second projection 127 of the bracket 120, respectively. Similarly stated, the first projection 125 and the second projection 127 can extend from the recessed wall 122 such that when the mount projection 101 is disposed within the opening 128 of the bracket 120, at least a portion of the first projection 125 and at least a portion of the second projection 127 extend into the first notch 105 and the second notch 107, respectively. Therefore, with the first projection 125 at least partially disposed within the first notch 105 and the second projection 127 at least partially disposed within the second notch 107, the bracket 120 can selectively retain the mount projection 101 within the opening 128. Thus, the housing 100 is coupled to the bracket 120. In some embodiments, the first projection 125 and the second projection 127 can be configured to move, relative to the recessed wall 122 such that the first projection 125 and the second projection 127 are no longer disposed within the first notch 105 and the second notch 107, respectively. In some embodiments, the bracket 120 can include an actuator (not shown in FIGS. 1-4) operatively coupled to the first projection 125 and the second projection 127 configured to move the first projection 125 and the second projection 127 to a second position, relative to the recessed wall 122, as further described herein. Once the first projection 125 and the second projection 127 are no longer disposed within the first notch 105 and the second notch 107, respectively, the mount projection 101 can be removed from the bracket 120.

Figure 5:
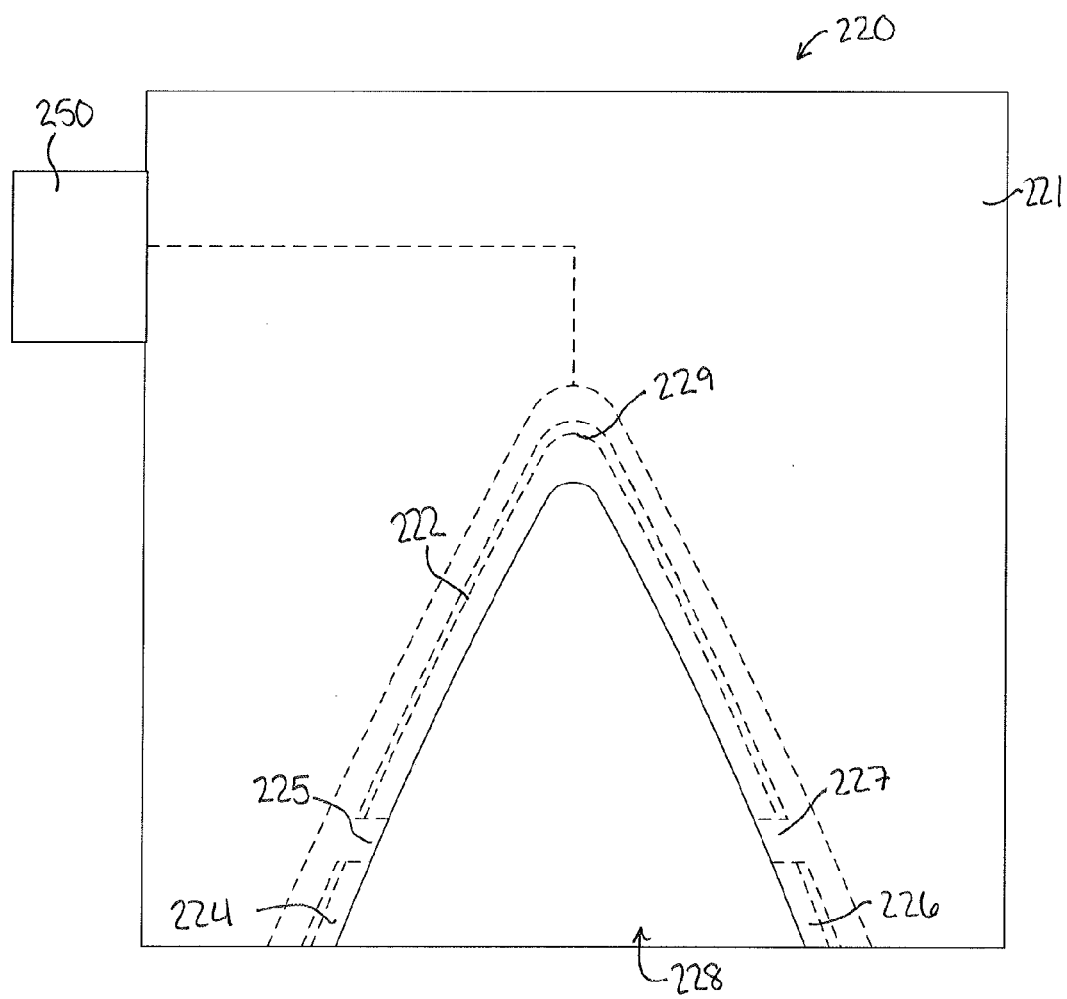
FIG. 5 is a schematic illustration of a bracket, according to an embodiment.

FIG. 5 is a schematic illustration of another embodiment of a bracket 220 that includes a base 221 and an actuator 250. The base 221 includes a recessed wall 222 having a first end portion 224, a second end portion 226, and a leading portion 229. The recessed wall 222 further includes a first projection 225 disposed at the first end portion 224 and a second projection 227 disposed at the second end portion 226.

The actuator 250 is configured to be operatively coupled to the first projection 225 and the second projection 227 and is configured to move between a first configuration and a second configuration. In some embodiments, the actuator 250 is directly coupled to the first projection 225 and the second projection 227 (e.g., monolithically formed). In other embodiments, the actuator 250 is operatively coupled to the first projection 225 and the second projection 227 (e.g., via an intervening structure). In this manner, the actuator 250 is configured to move the first projection 225 and the second projection 227 between a first position and a second position, relative to the recessed wall 222. More specifically, the first projection 225 and the second projection 227 are in the first position when the actuator 250 is in the first configuration, and the first projection 225 and the second projection 227 are moved to the second position when the actuator 250 is moved to the second configuration.

Figure 6:
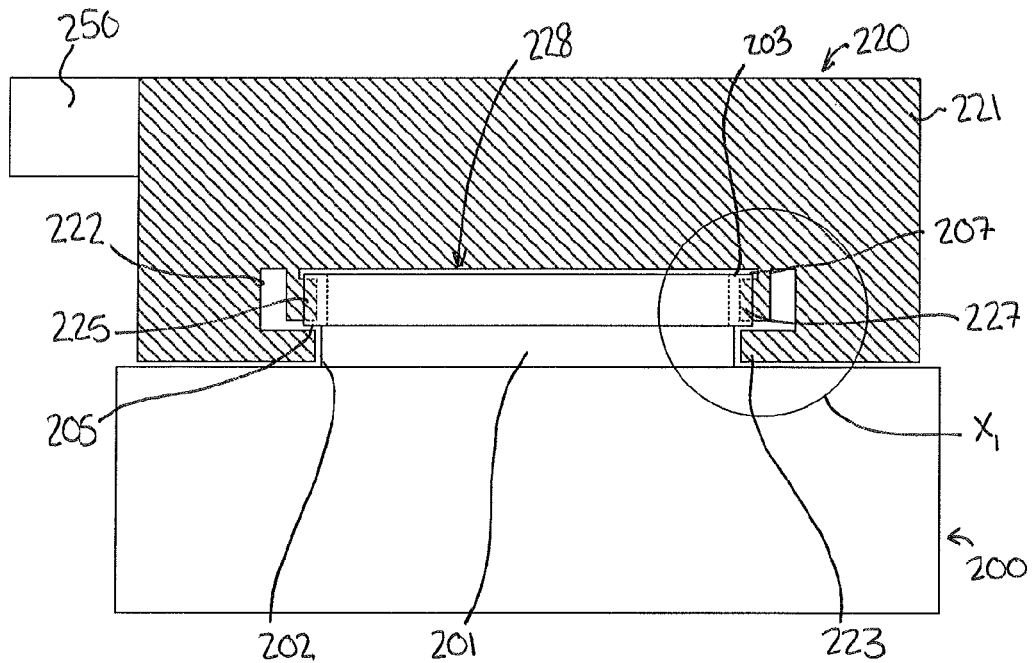
FIG. 6 is a schematic illustration of the bracket of FIG. 5 complimentarily mated with a housing in a first configuration, according to an embodiment.
Figure 7:
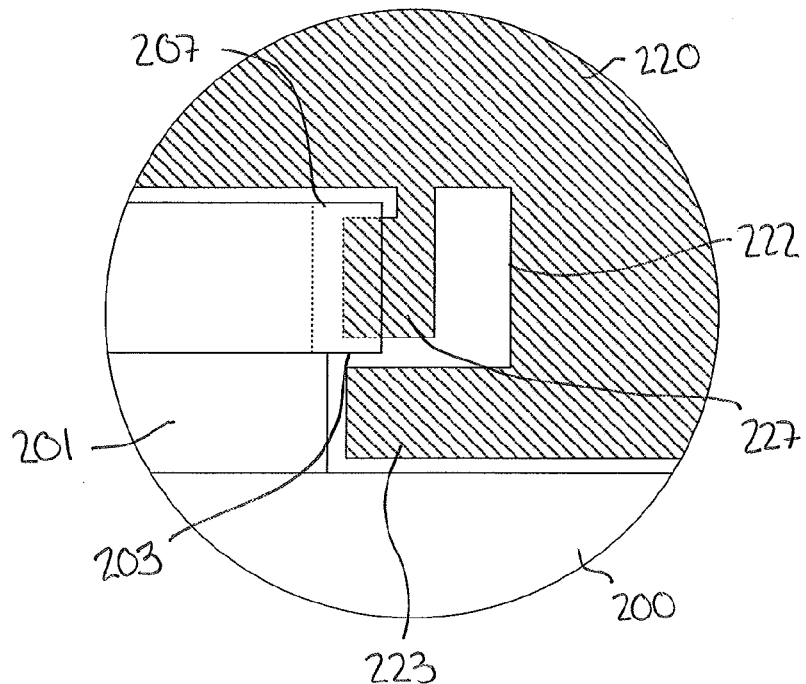
FIG. 7 is an enlarged view of a portion of the bracket and the housing indicated by the region $X_1$ in FIG. 6.

As shown in FIGS. 6 and 7, the recessed wall 222 of the bracket 220 defines an opening 228 configured to receive a portion of a housing 200. More specifically, the housing 200 (e.g., the housing of a WAP) includes a mount projection 201 including a recessed wall 202 and a lip 203. The housing 200 can be substantially similar to the housing 100 described above with reference to FIGS. 1-4, therefore, the housing 200 is not described in detail herein. The mount projection 201 of the housing 200 can be disposed within the opening 228 such that the lip 203 of the mount projection 201 is disposed within a space defined by the recessed wall 222, the lip 223, and a surface of the base 221 of the bracket 220. Furthermore, as shown in FIG. 6, the actuator 250 is in the first configuration such that the first projection 225 and the second projection 227 are in the first position relative to the recessed wall 222. In this manner, the first projection 225 and the second projection 227 are disposed, at least partially, within a first notch 205 and a second notch 207, respectively, defined by the lip 203 of the mount projection 201 (see e.g., the enlarged view of FIG. 7). Therefore, when in the first position, the first projection 225 and the second projection 227 releasably retain the mount projection 201 within the opening 228.

Figure 8:
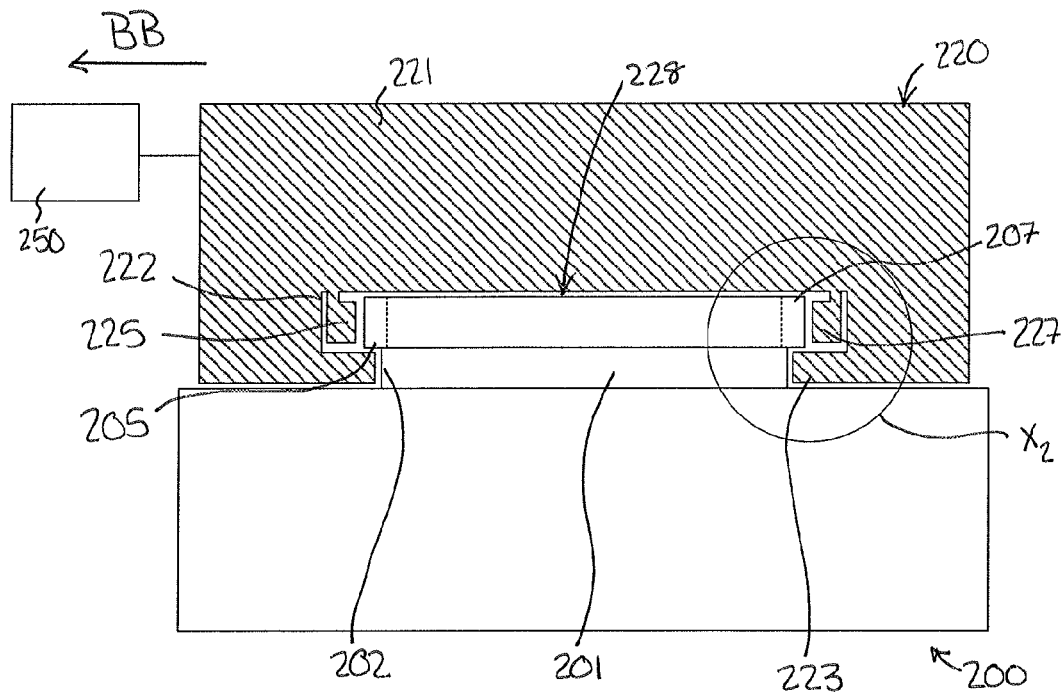
FIG. 8 is a schematic illustration of the bracket and the housing of FIG. 6 in a second configuration.
Figure 9:
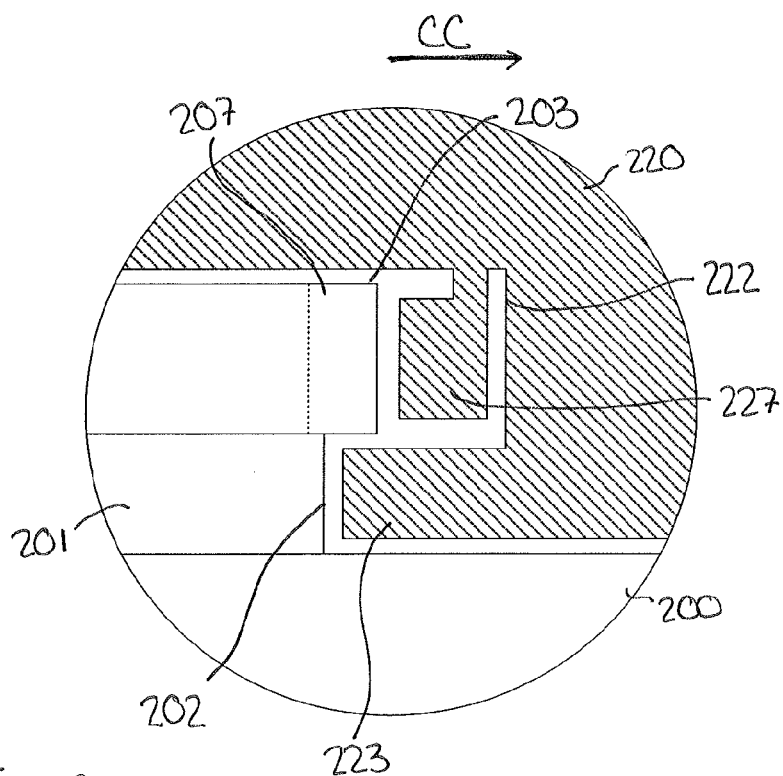
FIG. 9 is an enlarged view of a portion of the bracket and the housing indicated by the region $X_2$ in FIG. 8.

As shown in FIGS. 8 and 9, the actuator 250 can be moved to the second configuration, indicated by the arrow BB in FIG. 8. The actuator 250 can be of any suitable form, and can be slid, rotated, pulled, pushed, twisted, or otherwise actuated to be placed in the second configuration in accordance with the form of the actuator 250. Furthermore, with the actuator 250 moved to the second configuration, the first projection 225 and the second projection 227 can be moved to the second position relative to the recessed wall 222, indicated by the arrow CC in FIG. 9. While FIG. 9 only illustrates the second projection 227, the first projection 225 is configured to move with a similar magnitude in a second direction, substantially opposite the direction CC (see e.g., FIG. 8). Therefore, the first projection 225 and the second projection 227 are configured to be substantially removed from the first notch 205 and the second notch 207 such that the mount projection 201 can be removed from the bracket 220.

Figure 10:
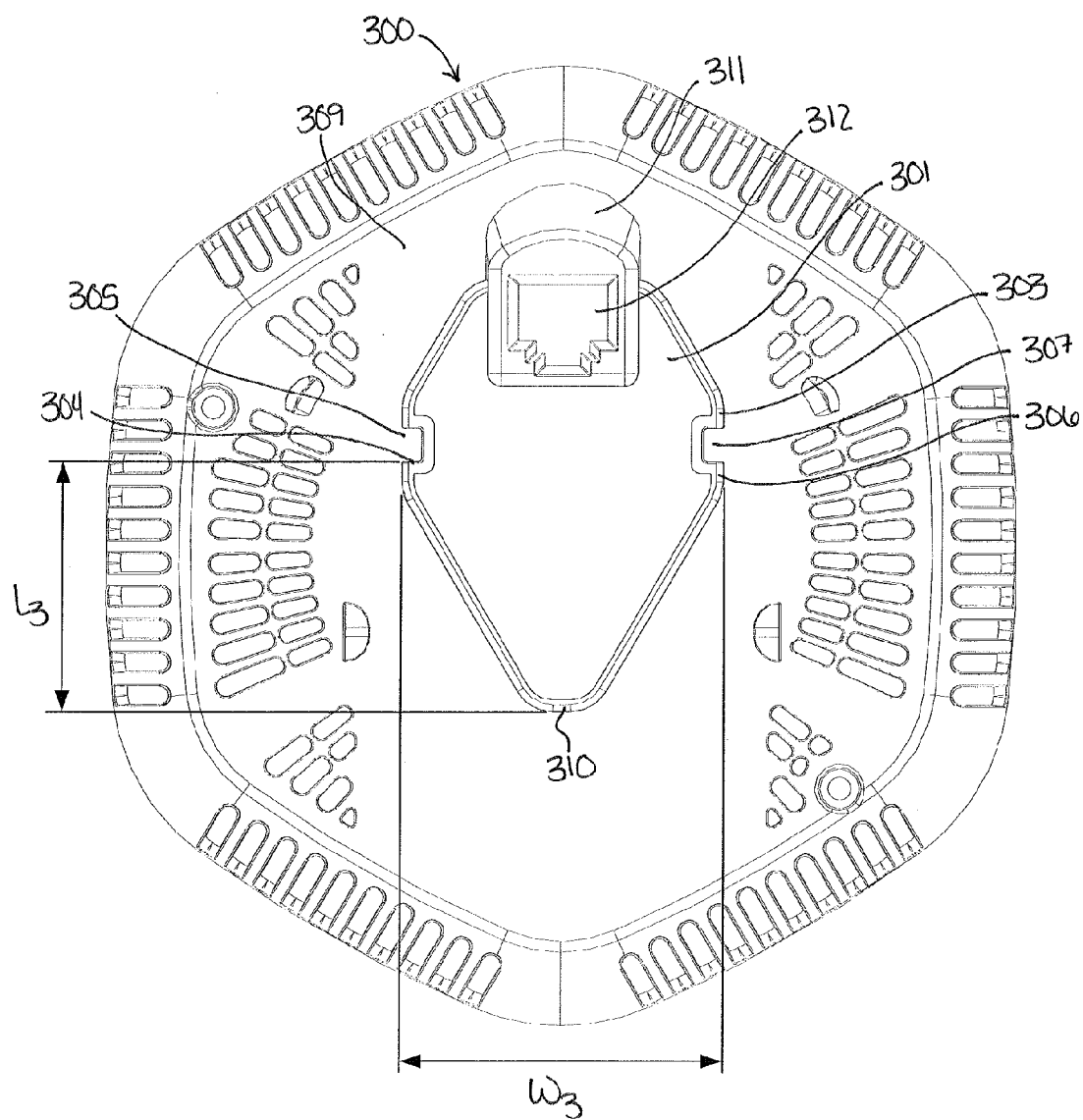
FIG. 10 is a top view of a portion of a housing, according to an embodiment.
Figure 11:
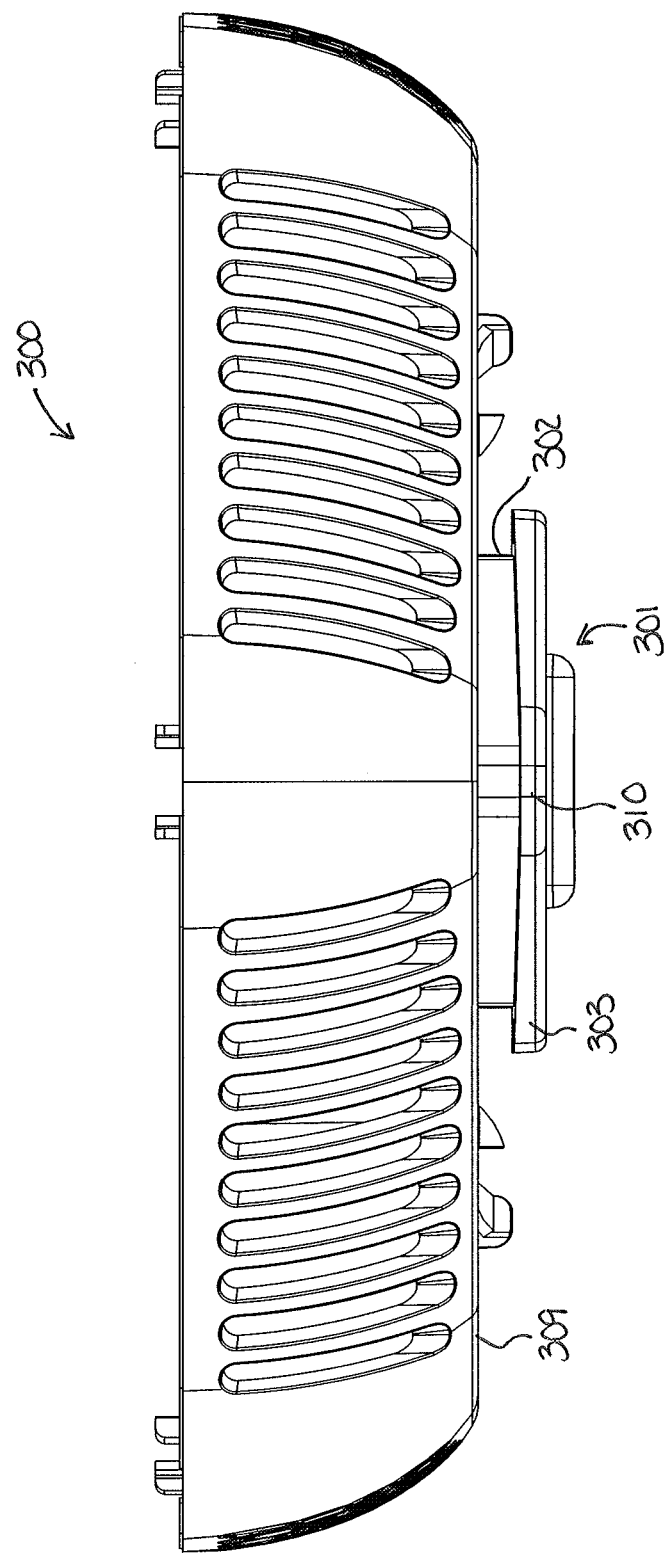
FIG. 11 is a front view of the portion of the housing of FIG. 10.
Figure 12:
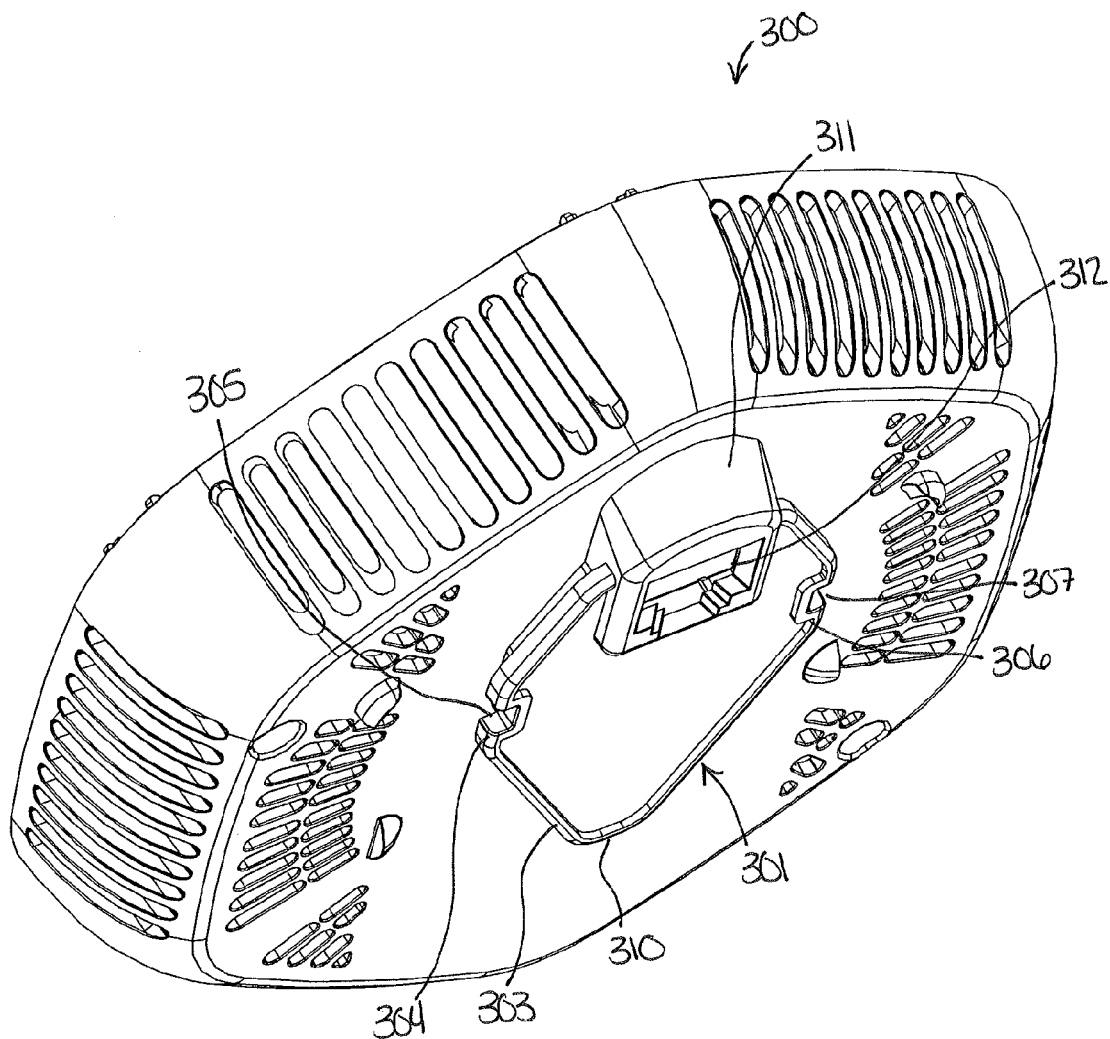
FIG. 12 is a perspective view of the portion of the housing of FIG. 10.
Figure 13:
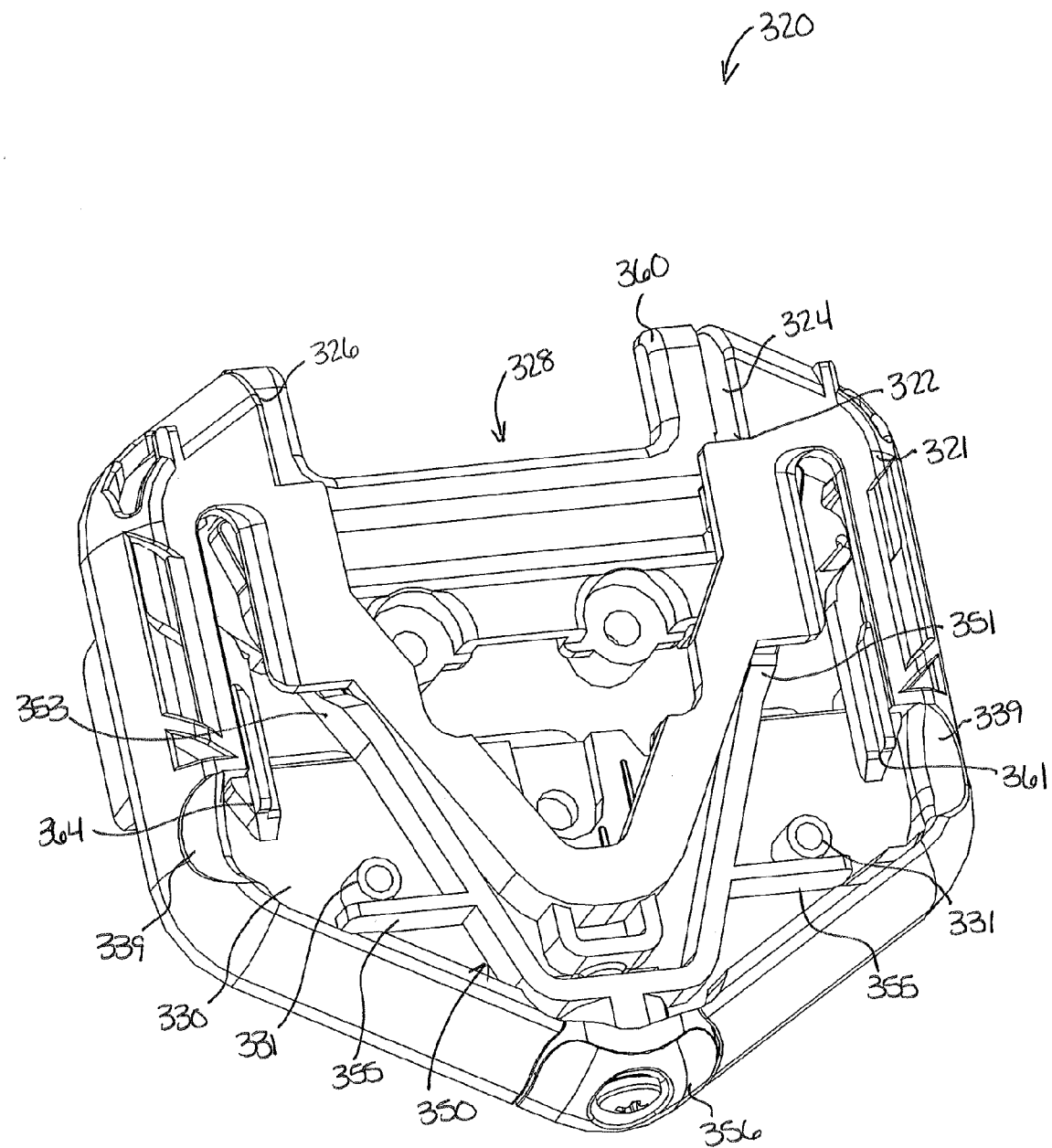
FIG. 13 is a perspective view of a bracket, according to an embodiment.

FIGS. 10-12 illustrate a portion of a wireless access point housing 300 (referred to herein as housing 300), according to an embodiment. The housing 300 includes a base 309 from which a mount projection 301 extends. The housing 300 can be any suitable shape, size, or configuration and is configured to house a set of electrical components. The mount projection 301 includes a jack portion 311 defining a port 312 configured to receive a connector (e.g., an electrical connector such as a CAT5 connector) to operatively connect the components disposed within the housing 300 to components substantially outside the housing 300.

The mount projection 301 includes a recessed wall 302 and a lip 303, configured to extend from the recessed wall 302. The mount projection 301 further includes a first end portion 304, a second end portion 306, and a leading portion 310. In this manner, the mount projection 301 has a maximum width $W_3$ defined between a point of the first end portion 304 and a point of the second end portion 306, and a length $L_3$ between the leading portion 310 and a line (not shown in FIG. 1) associated with the maximum width $W_3$. The recessed wall 302 is configured to extend, substantially continuously, between the first end portion 304 and the second end portion 306 such that at least a portion of the mount projection 301 defines a substantially conical cross-sectional shape. Similarly stated, at least a portion of the recessed wall 302 defines a substantially conical cross-sectional shape between the line associated with the maximum width $W_3$ and the leading portion 310.

As described above, the lip 303 of the mount projection 301 is configured to extend from the surface of the recessed wall 302. The lip 303 can be any suitable shape, size, or configuration. For example, the lip 303 can extend substantially uniformly from the recessed wall 302 such that the lip 303 has a substantially consistent width and height between the first end portion 304 and the second end portion 306 of the mount projection 301. The lip 303 defines a first notch 305 disposed at the first end portion 304 of the mount projection 301, and a second notch 307 disposed at the second end portion 305 of the mount projection 301. In this manner, the housing 300 is configured to be coupled to a bracket such that a surface of the lip 303 defining the first notch 305 and a surface of the lip 303 defining the second notch 307 are engage a portion of a bracket, as further described herein.

Figure 14:
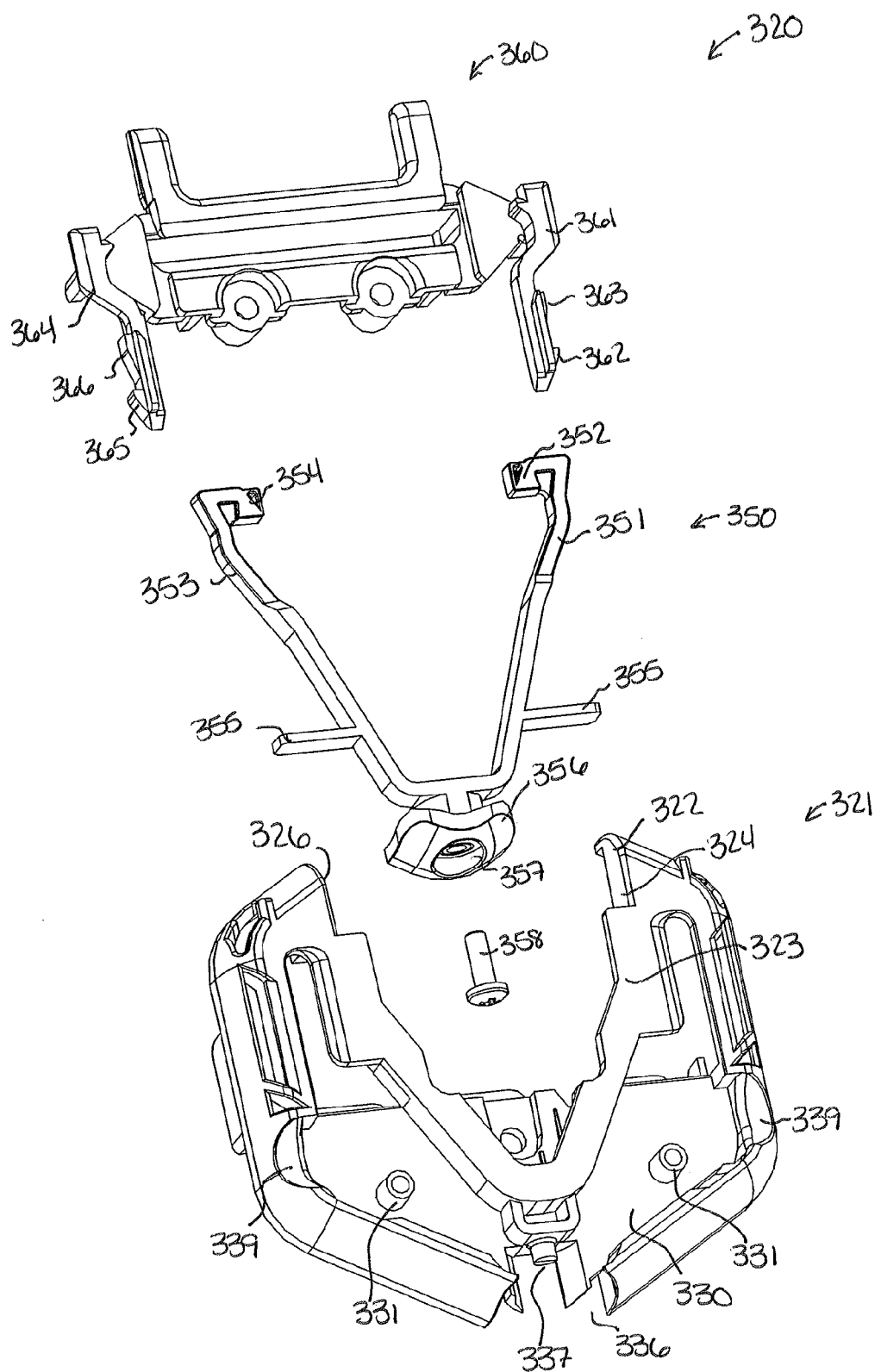
FIG. 14 is an exploded view of the bracket of FIG. 13.
Figure 15:
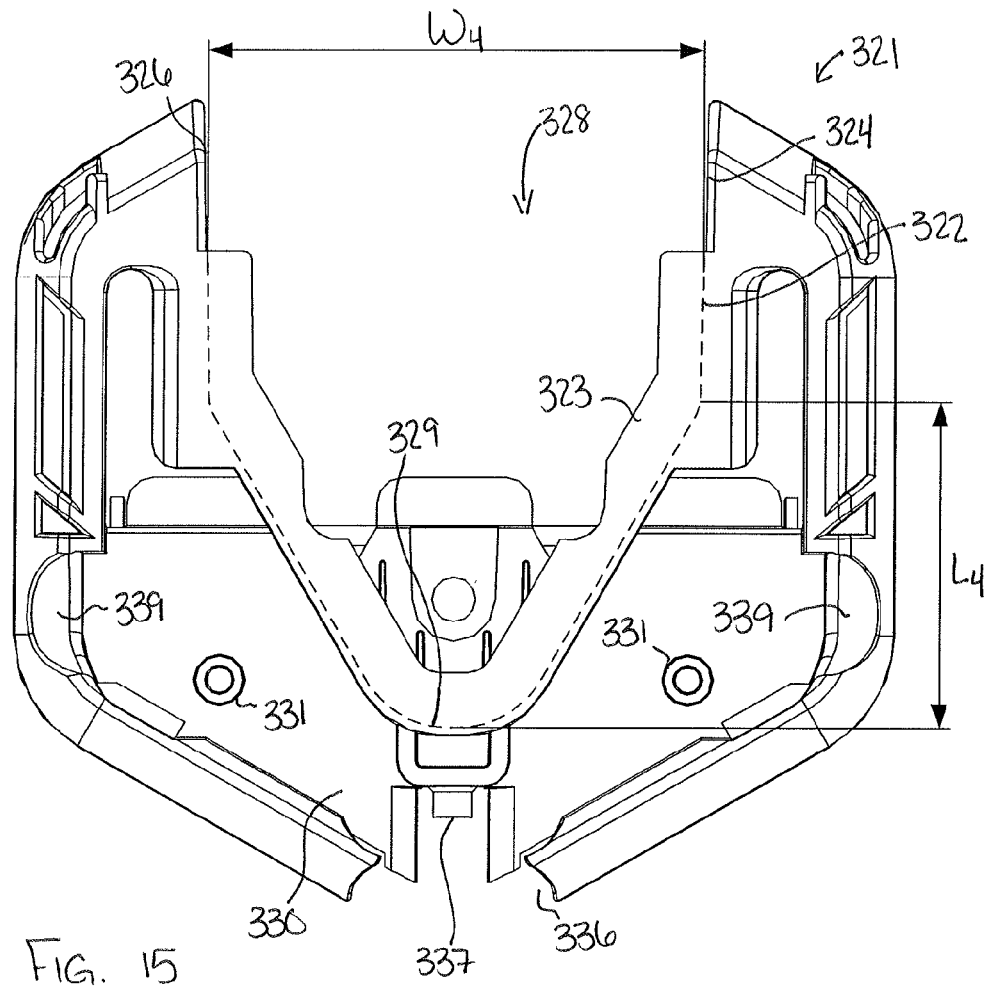
FIG. 15 is a top view of a base included in the bracket of FIG. 13.
Figure 16:
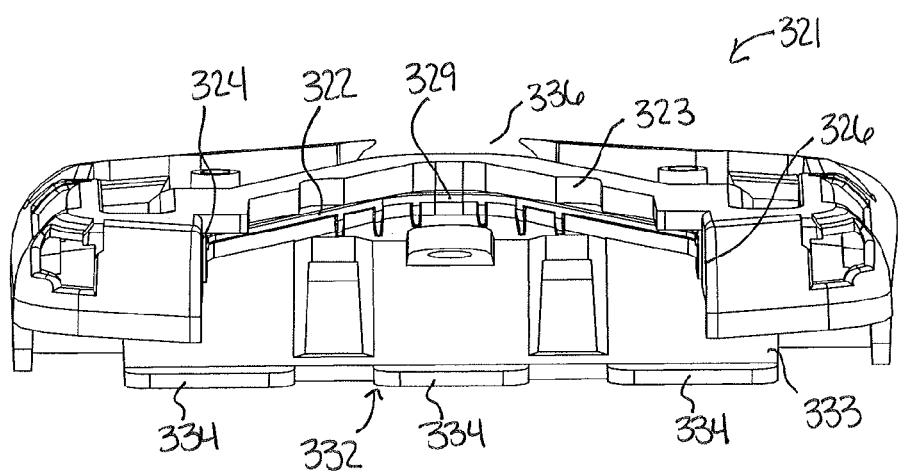
FIG. 16 is a perspective view of the base of FIG. 15.

For example, FIG. 13-19 illustrate a bracket 320 configured to be coupled to the housing 300, according to an embodiment. The bracket 320 can be any suitable shape, size, or configuration and can be formed from any suitable material (e.g., a plastic). As shown in FIG. 14, the bracket 320 includes a base 321, an actuator 350, and a coupler member 360. The base 321 includes a top surface 330 (see the top view of FIG. 15) and a bottom surface 332 (see the bottom view and the bottom perspective view of FIGS. 16 and 17, respectively). The top surface 330 includes a set of protrusions 331 and defines a set of grooves 339, as further described herein. The top surface 330 further defines a recessed wall 322. More specifically, the recessed wall 322 includes a lip 323 such that the recessed wall 322 and the lip 323 define an opening 328 configured to receive at least a portion of the mount projection 301 of the housing 300. The bottom surface 332 includes an extension 333 having a set of tabs 334 configured to selectively engage a secondary mounting apparatus, as described in further detail herein.

Figure 17:
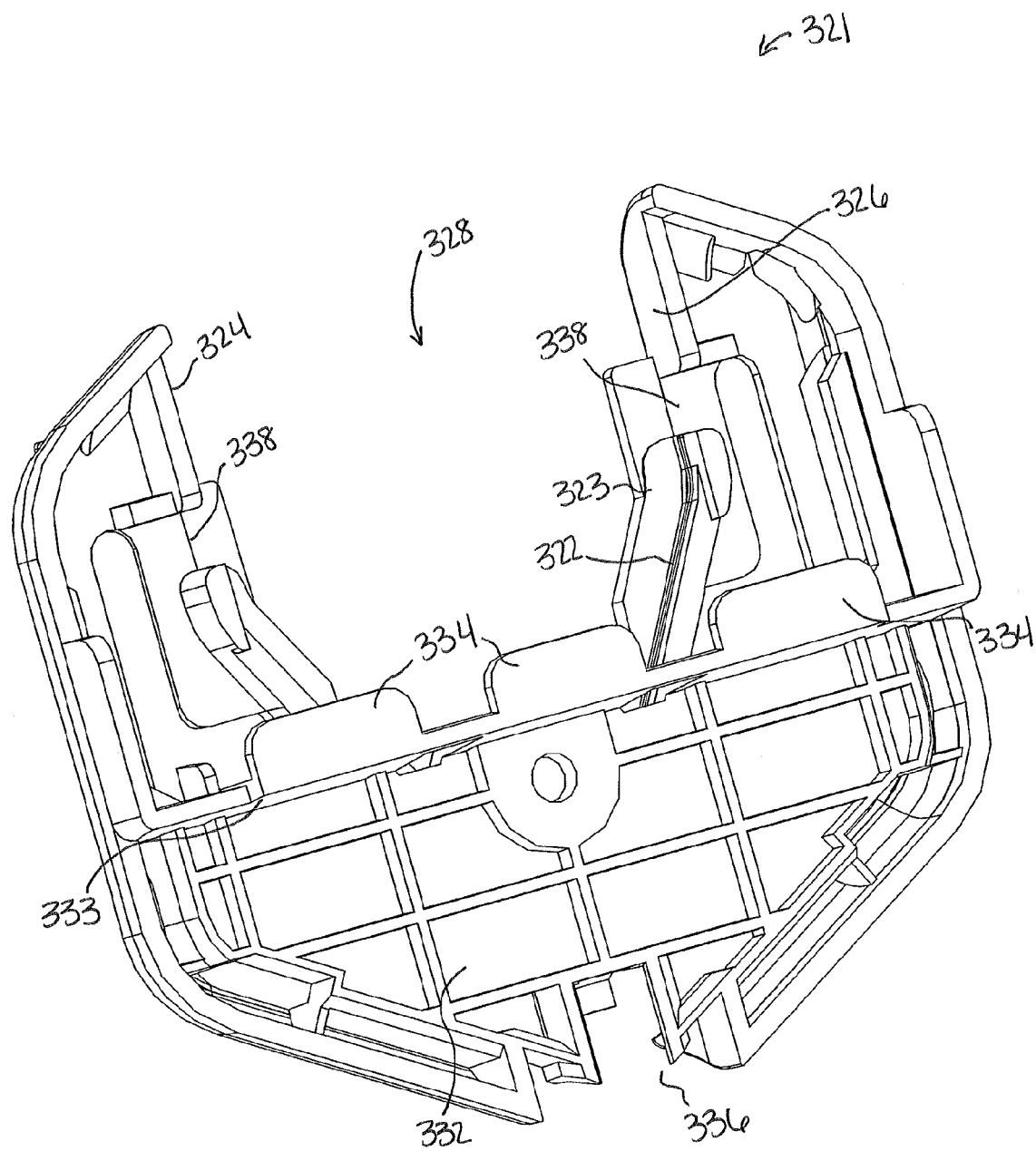
FIG. 17 is a bottom perspective view of the base illustrated in FIG. 15.

The recessed wall 322 includes a first end portion 324, a second end portion 326, and a leading portion 329. More specifically, the recessed wall 322 has a maximum width $W_4$, defined between a point of the first end portion 324 and a point of the second end portion 326, and a length $L_4$ between the leading portion 329 and a line (not shown in FIG. 15) associated with the maximum width $W_4$. In this manner, the recessed wall 322 is configured to extend, substantially continuously, between the first end portion 324 and the second end portion 326 such that at least a portion of the recessed wall 322 defines a substantially conical cross-sectional shape. Furthermore, the width $W_4$ and the length $L_4$ of the recessed wall 322 are configured to correspond to the width $W_3$ and the length $L_3$ of the mount projection 301, as further described herein. As shown in FIG. 17, the recessed wall 322 defines a set of notches 338 configured to receive a portion of the actuator 350, as further described herein. Similarly, the base 321 defines an actuator channel 336 and includes a stop 337 configured to receive and/or engage an engagement portion 356 of the actuator 350, as described in further detail herein.

The actuator 350 can be any suitable shape, size, or configuration. For example, as shown in FIG. 14, the actuator 350 can have a substantially wishbone shape (e.g., forked or otherwise bifurcated). The actuator 350 includes a first end portion 351, a second end portion 353, and an engagement portion 356 and is configured to be moved between a first configuration and a second configuration. The first end portion 351 and the second end portion 353 include a first projection 352 and a second projection 354, respectively. The actuator 350 further includes a set of extension 355 configured to protrude from a portion of the actuator 350. In use, the extensions 355 are configured to engage a portion of the base 321 when the actuator 350 is moved between the first configuration and the second configuration, as further described herein. The engagement portion 356 includes an aperture 357 configured to receive a security member 358. The security member 358 is configured to contact a portion of the base 321 to limit the movement of the actuator 350 relative to the base 321. For example, the security member 358 can be configured to engage the base 321 to maintain the actuator 350 in the first configuration, as described in further detail herein. The security member 358 can be any suitable member such as, for example, a screw, pin, plug, or the like. In some embodiments, such as those where the security member 358 is a screw, the security member 358 can have a non-standard interface (e.g., a non-standard screw head) configured to receive a non-standard tool. In this manner, the bracket 320 can be configured such that the non-standard tool need be used to remove the security member 358 from the bracket 320, thereby providing a layer of security against anyone without the non-standard tool.

Figure 18:
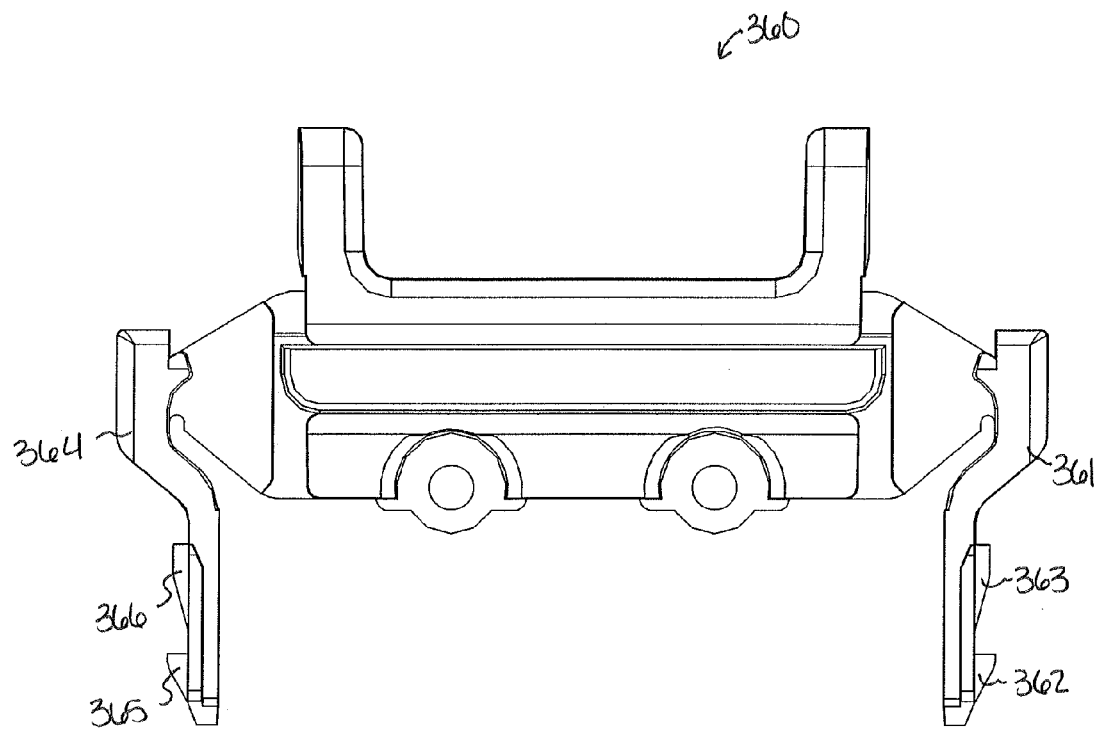
FIG. 18 is a top view of a coupler member included in the bracket of FIG. 13.
Figure 19:
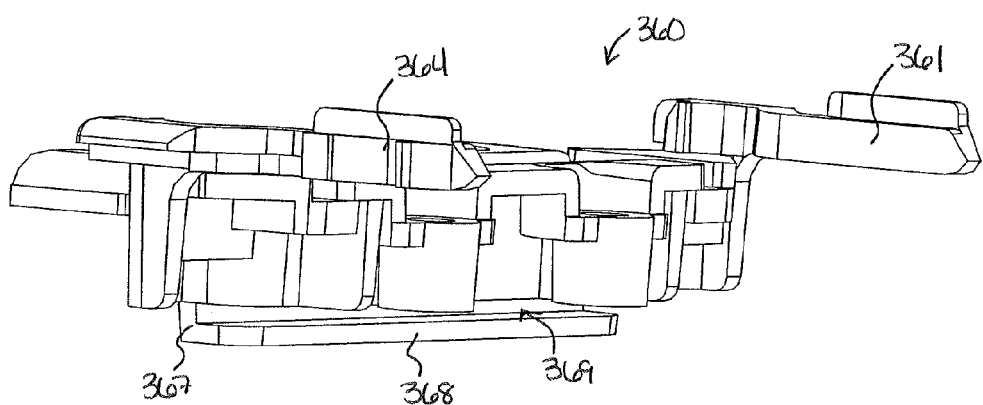
FIG. 19 is a perspective view of the coupler member of FIG. 18.

As shown in FIGS. 18 and 19, the coupler member 360 includes a first arm 361, a second arm 364, and an extension 367. The first arm 361 includes a first latch 362 and a second latch 363 configured to selectively engage a surface of the base 321. Similarly, the second arm 364 includes a first latch 365 and a second latch 366 configured to engage a second surface the base 321. The extension 367 is configured to extend from a bottom surface of the coupler member 360 to define a recess 369 between a tab 368 and the bottom surface. As described in further detail herein, the coupler member 360 is configured to be selectively coupled to the base 321 and moved between a first position and a second position, relative to the base 321.

Figure 20:
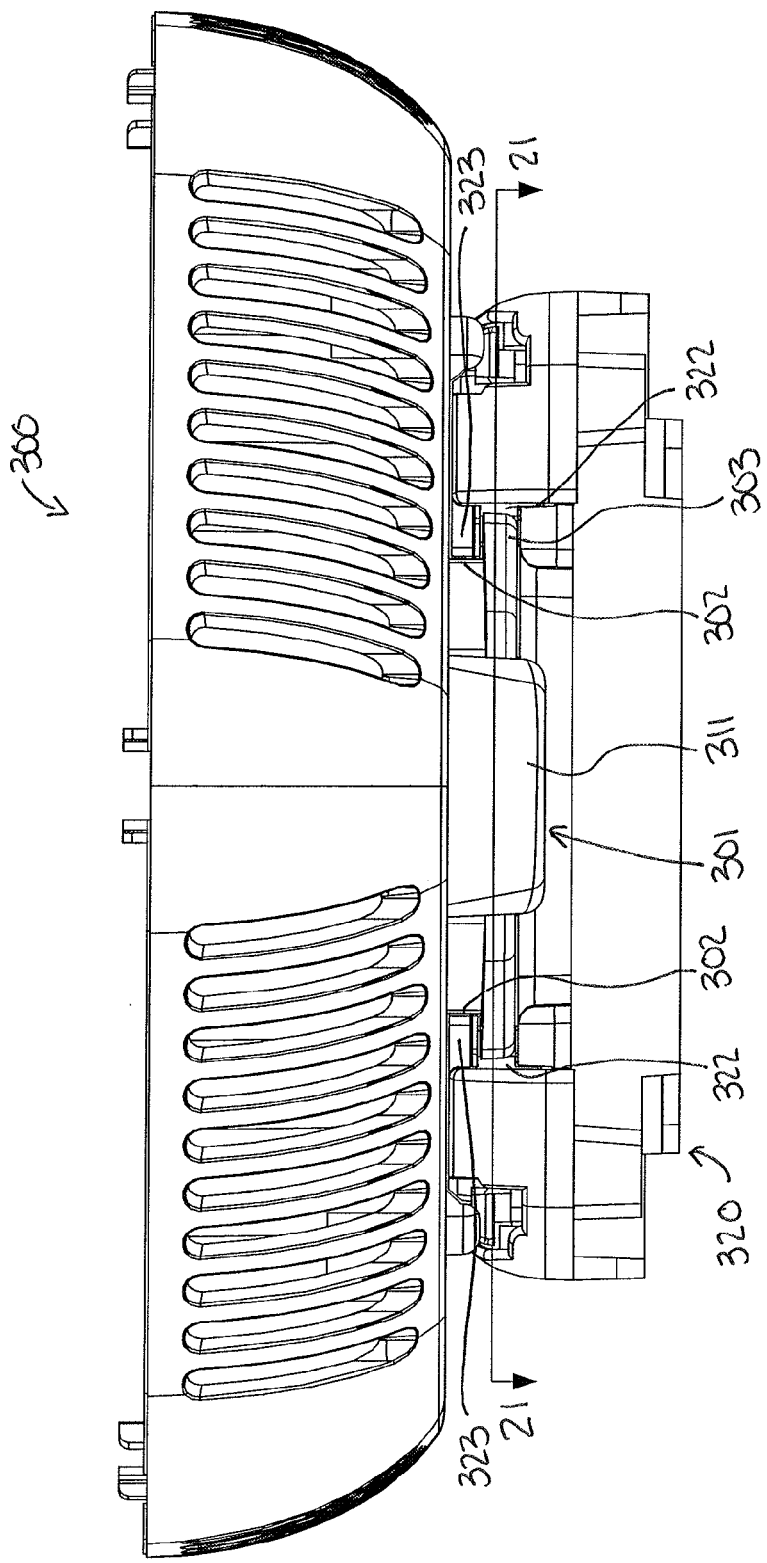
FIG. 20 is a front view of the housing of FIG. 10 complimentarily mated with the bracket of FIG. 13.

In use, for example as shown in FIG. 20, the mount projection 301 of the housing 300 can be removably disposed within the opening 328 defined by the bracket 320 such that the lip 303 of the mount projection 301 is disposed within the space defined by the recessed wall 322, the lip 323, and the top surface 330 of the bracket 320. Moreover, the conical cross-sectional shape of the recessed wall 322 can be such that the mount projection 301 is guided towards the leading portion 329 of the recessed wall 322. Similarly stated, the recessed wall 322 of the bracket 320 can facilitate the alignment of the mount projection 301 relative to the bracket 320. Thus, the mount projection 301 can be inserted into the opening 328 over a range of angles and need not be aligned in a given angular orientation.

Figure 21:
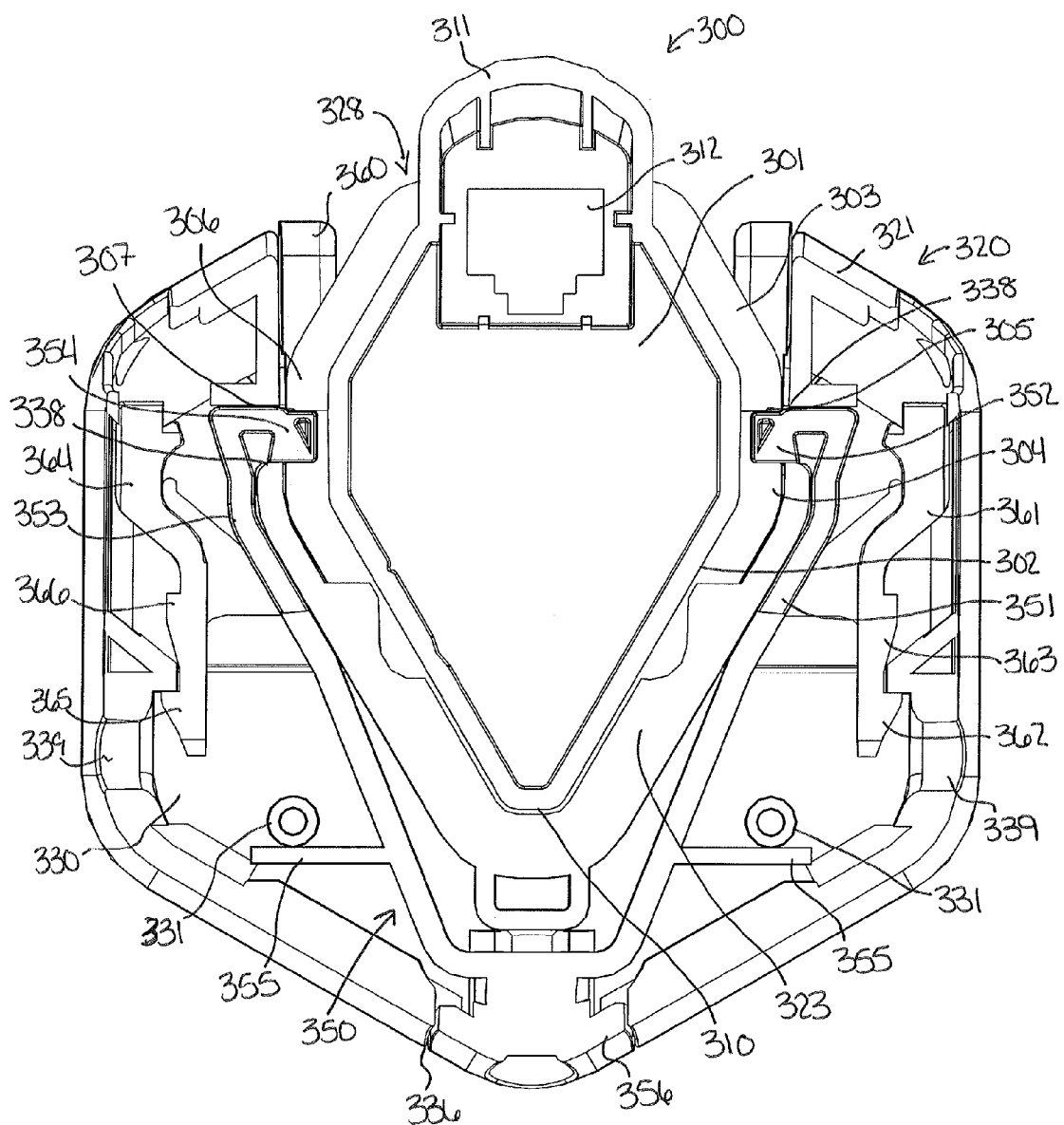
FIG. 21 is a cross-sectional view of the housing complimentarily mated with the bracket taken along the line 21-21 in FIG. 20, in a first configuration.

As shown in FIG. 21, the actuator 350 can be configured to be in the first configuration such that the first projection 352 and the second projection 354 extend through the notches 338 defined by the recessed wall 322. In this manner, the first projection 352 can extend from the first end portion 324 of the recessed wall 322 of the bracket 320 and be at least partially disposed within the first notch 305 defined by the lip 303 of the mount projection 301. Similarly, the second projection 354 can extend from the second end portion 326 of the recessed wall 322 and be at least partially disposed within the second notch 307 defined by the lip 303. The arrangement of the first projection 352 and the second projection 354 within the first notch 305 and the second notch 307, respectively, selectively maintains the mount projection 301 within the opening 328. Similarly stated, with the first projection 352 and the second projection 354 disposed, at least partially, within the first notch 305 and the second notch 307, respectively, the movement of the mount projection 301, relative to the bracket 320 is substantially limited.

In addition, the lip 323 of the bracket 320 is configured to extend about a portion of the lip 303 of the mount projection 301. In this manner, the lip 323 of the bracket 320 further limits the movement of the mount projection 301, relative to the bracket 320 (e.g., in a direction normal to the top surface 330 of the bracket 320). Similarly stated, the lip 323, the first projection 352, and the second projection 354 selectively engage the mount projection 301 such that the housing 300 is coupled to the bracket 320. Furthermore, the security member 358 can be inserted into the aperture 357 defined by the engagement portion 356 of the actuator 350 to maintain the actuator 350 in the first configuration. More specifically, the security member 358 can be inserted into the aperture 357 such that a portion of the security member 358 engages a stop 337 of the bracket 320. In this manner, the security member 358 substantially limits the motion of the actuator 350, relative to the bracket 320, to facilitate the coupling of the hosing 300 to the bracket 320. Similarly stated, the security member 358 substantially prevents movement of the actuator 350 to the second configuration such that the first projection 352 and the second projection 354 are substantially maintained within the first notch 305 and the second notch 307, respectively.

Figure 22:
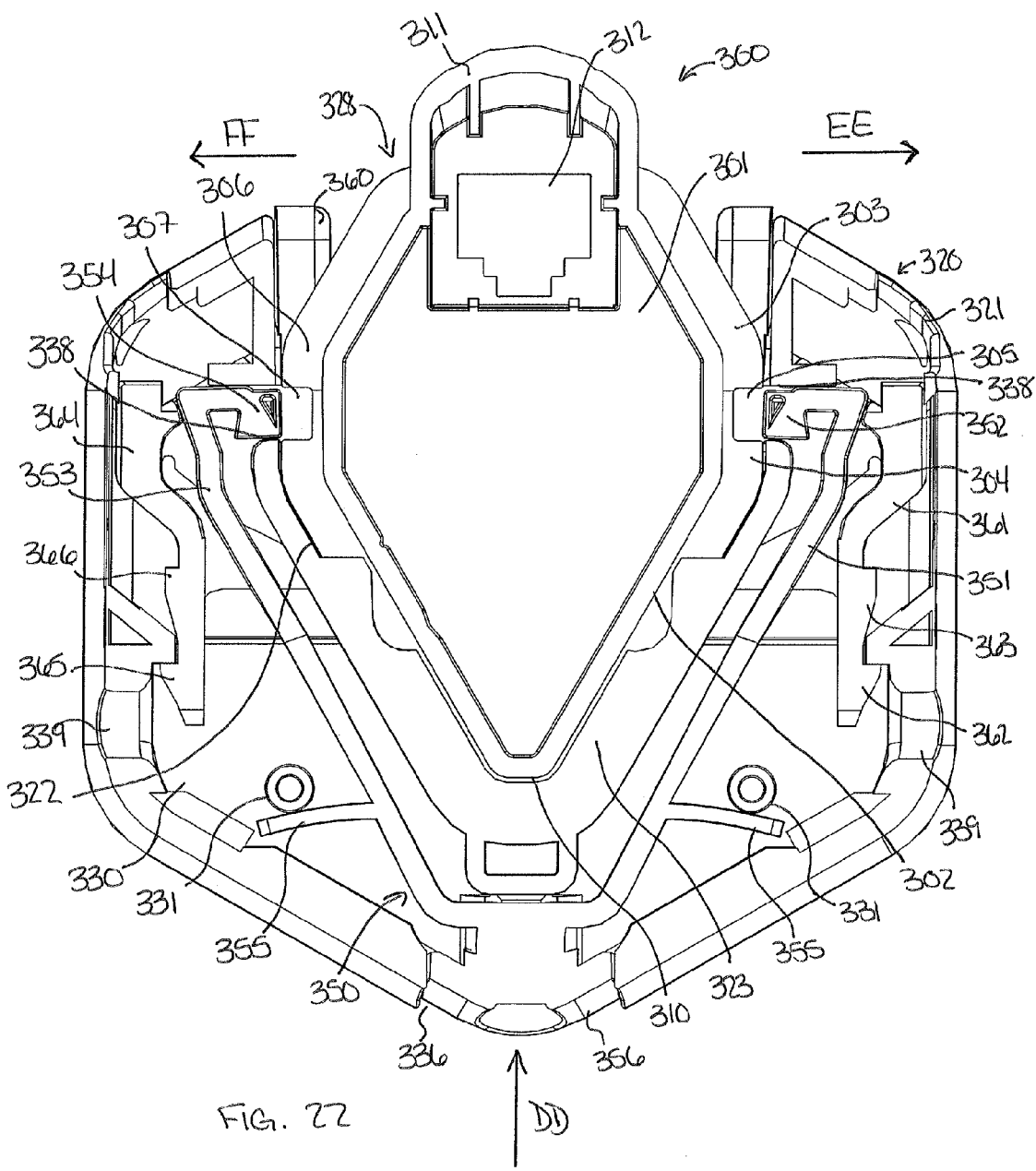
FIG. 22 is a cross-sectional view of the housing complimentarily mated with the bracket taken along the line 21-21 in FIG. 20, in a second configuration.

As shown in FIG. 22, when the security member 358 is removed from the aperture 357 of the actuator 350, a user can contact the engagement portion 356 to move the actuator 350 to the second configuration. More specifically, the engagement portion 356 of the actuator 350 can be moved in the direction of the arrow DD. The movement of the actuator 350 places the extensions 355 of the actuator 350 in contact with the protrusions 331 extending from the first surface 330 of the bracket 320. In this manner, the first end portion 351 and the second end portion 353 of the actuator 350 are configured to deform (e.g., bend, twist, curve, or otherwise reconfigure), such that the first projection 352 moves in the direction of the arrow EE and the second projection 354 moves in the direction of the arrow FF. Expanding further, the first projection 352 and the second projection 354 engage a surface of the bracket 320 that defines the notches 338 such that the motion of the first projection 352 and the second projection 354 is substantially limited to the direction EE and FF, respectively. Therefore, when the actuator 350 is placed in the second configuration (FIG. 22), the first projection 352 and the second projection 354 are substantially removed from the first notch 305 and the second notch 307 (respectively) of the mount projection 301. In this manner, the mount projection 301 can be moved in the direction of the arrow DD such that the housing 300 is decoupled from the bracket 320. Moreover, the arrangement of the housing 300 coupled to the bracket 320 can be such that a user can actuate the actuator 350 (e.g., move the engagement portion 356 in the direction of the arrow DD) and remove the housing 300 from the bracket 320 with one hand.

Figure 23:
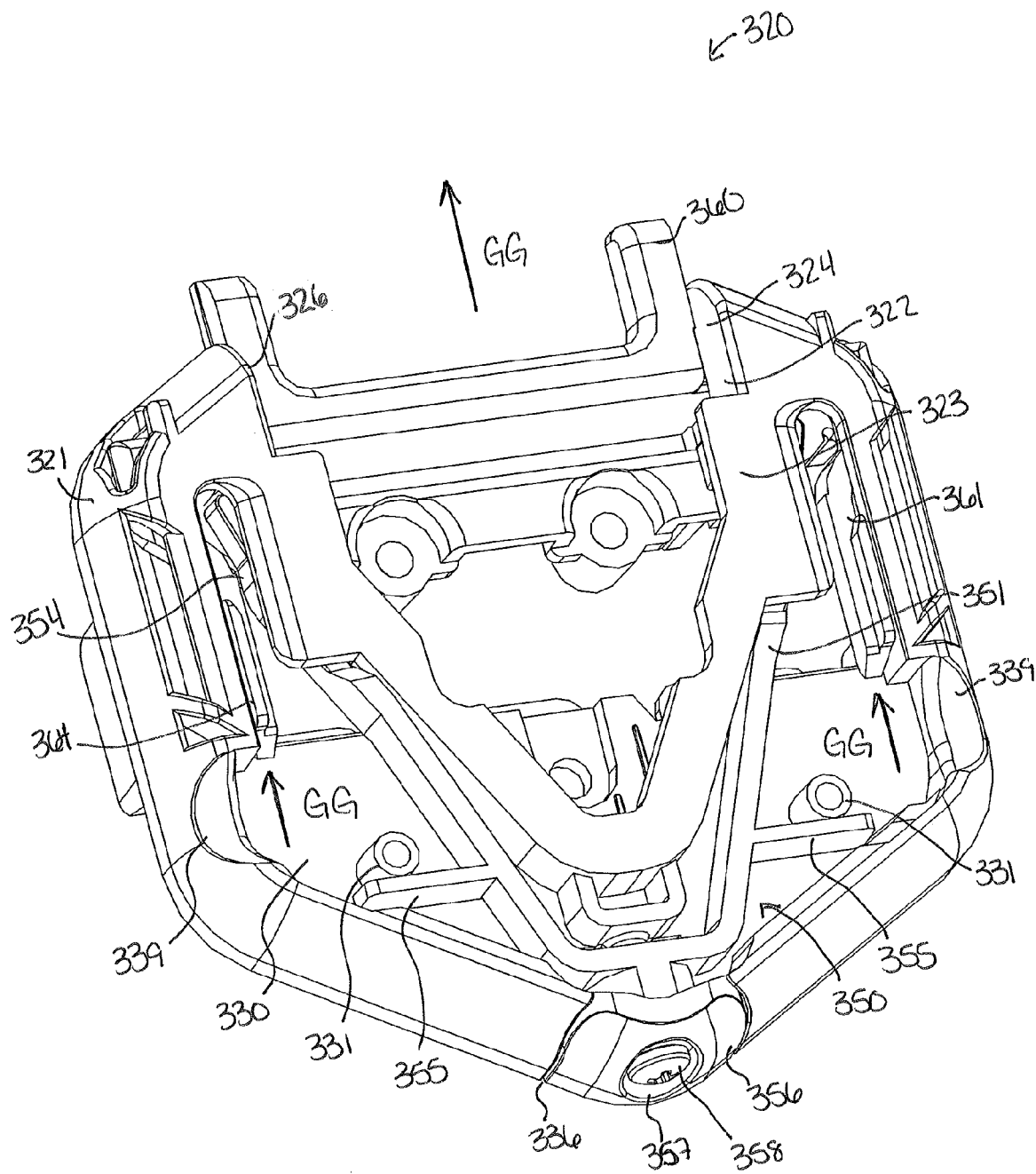
FIG. 23 is a perspective view of the bracket of FIG. 13, illustrating the coupler member in a first configuration.
Figure 24:
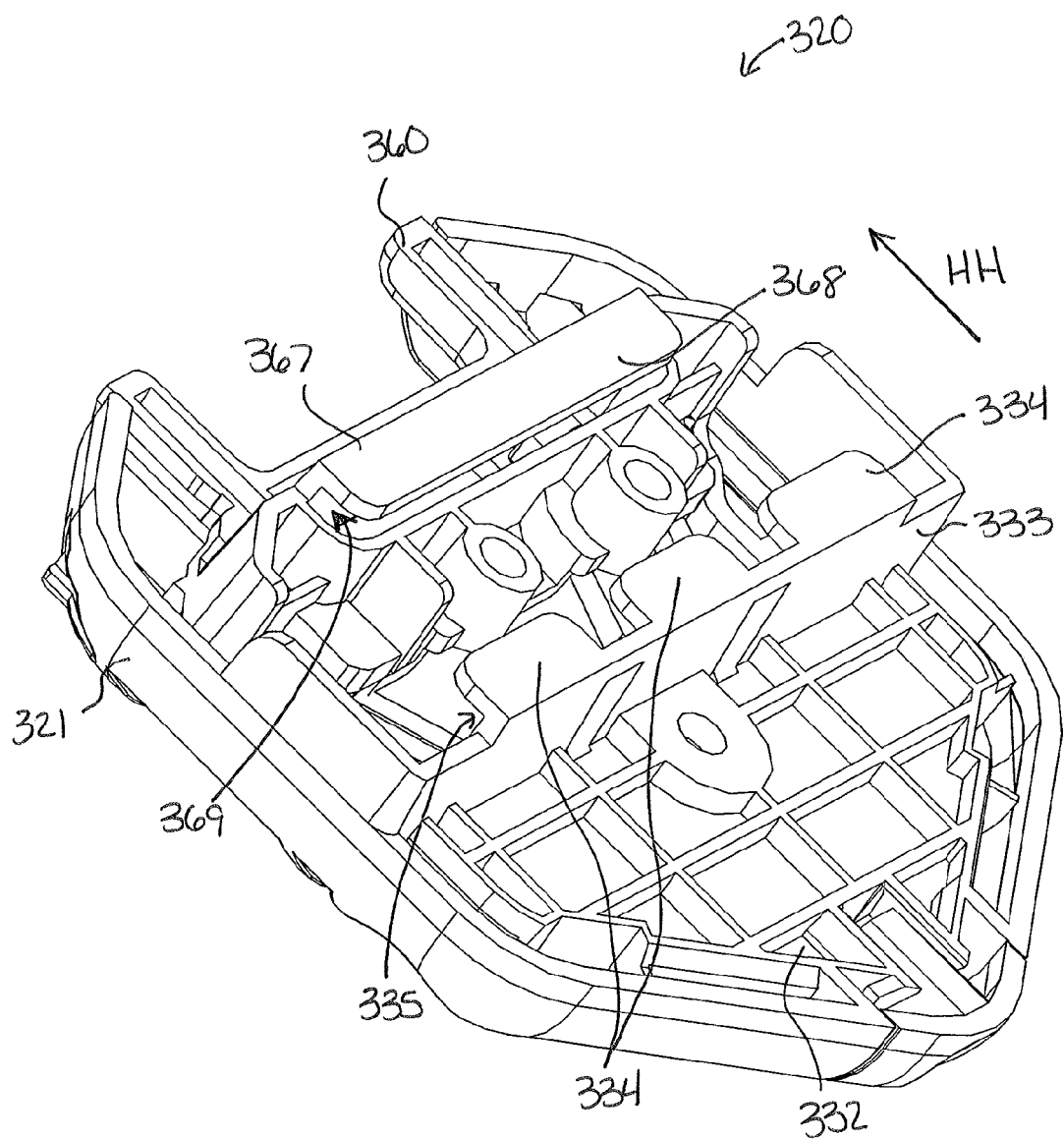
FIG. 24 is a perspective view of the bracket of FIG. 13, illustrating the coupler member in a second configuration.

In some embodiments, the bracket 320 can be mounted to a secondary bracket. In such embodiments, the coupler member 360 can be moved between a first position and a second position, relative to the base 321. For example, the first coupler member 360 can be moved in the direction of the arrows GG, shown in FIG. 23, to place the coupler member 360 in the first position relative to the base 321. In this manner, the first arm 361 and the second arm 364 move beyond the surface of the base 321 defining the groove 339 and a space between the extension 333 of the base 321 (see FIG. 24) and the extension 367 of the coupler member 360 is increased, as indicated by the arrow HH in FIG. 24.

Figure 25:
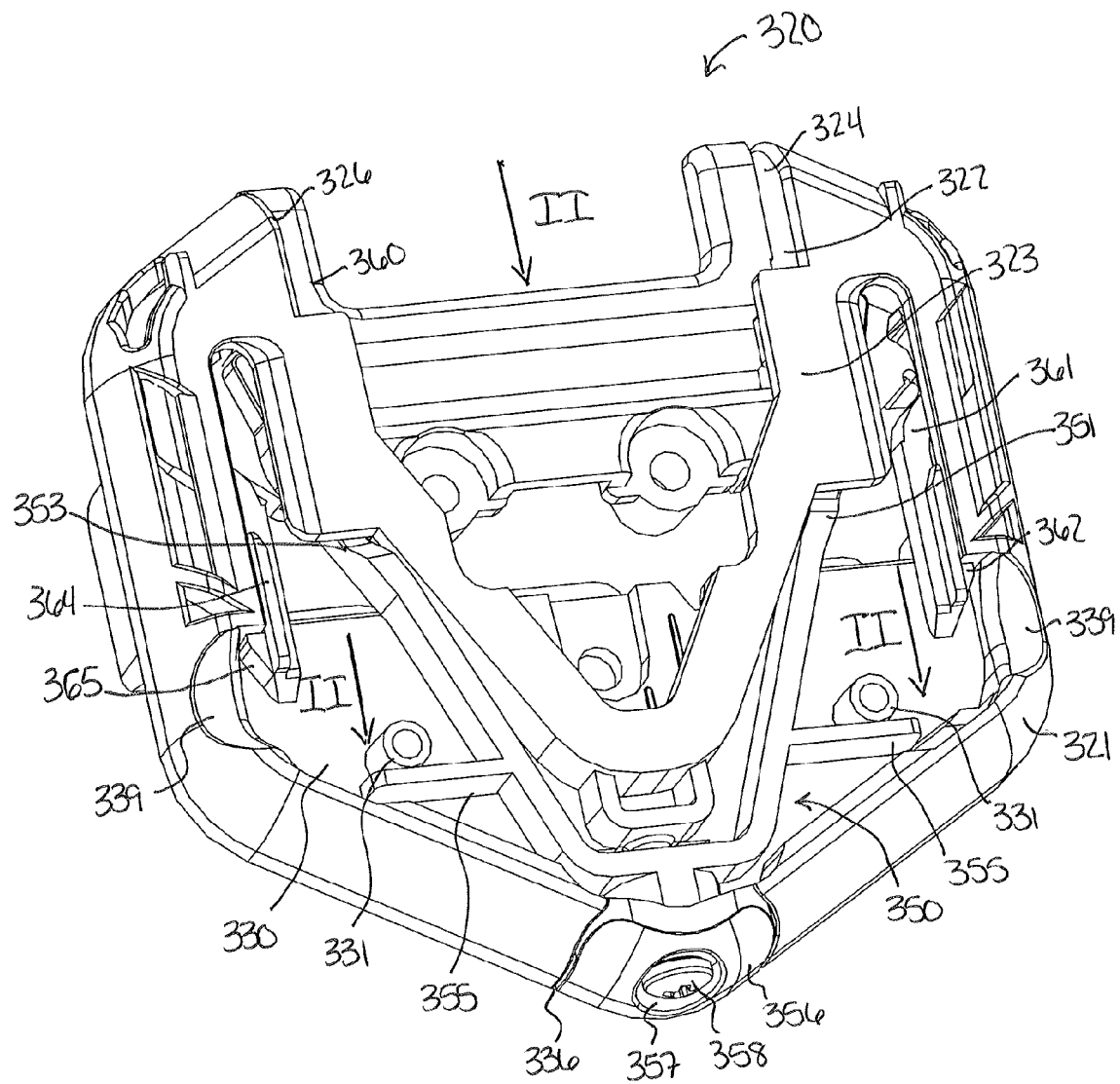
FIG. 25 is a bottom perspective view of the bracket of FIG. 13, illustrating the coupler in the second configuration.
Figure 26:
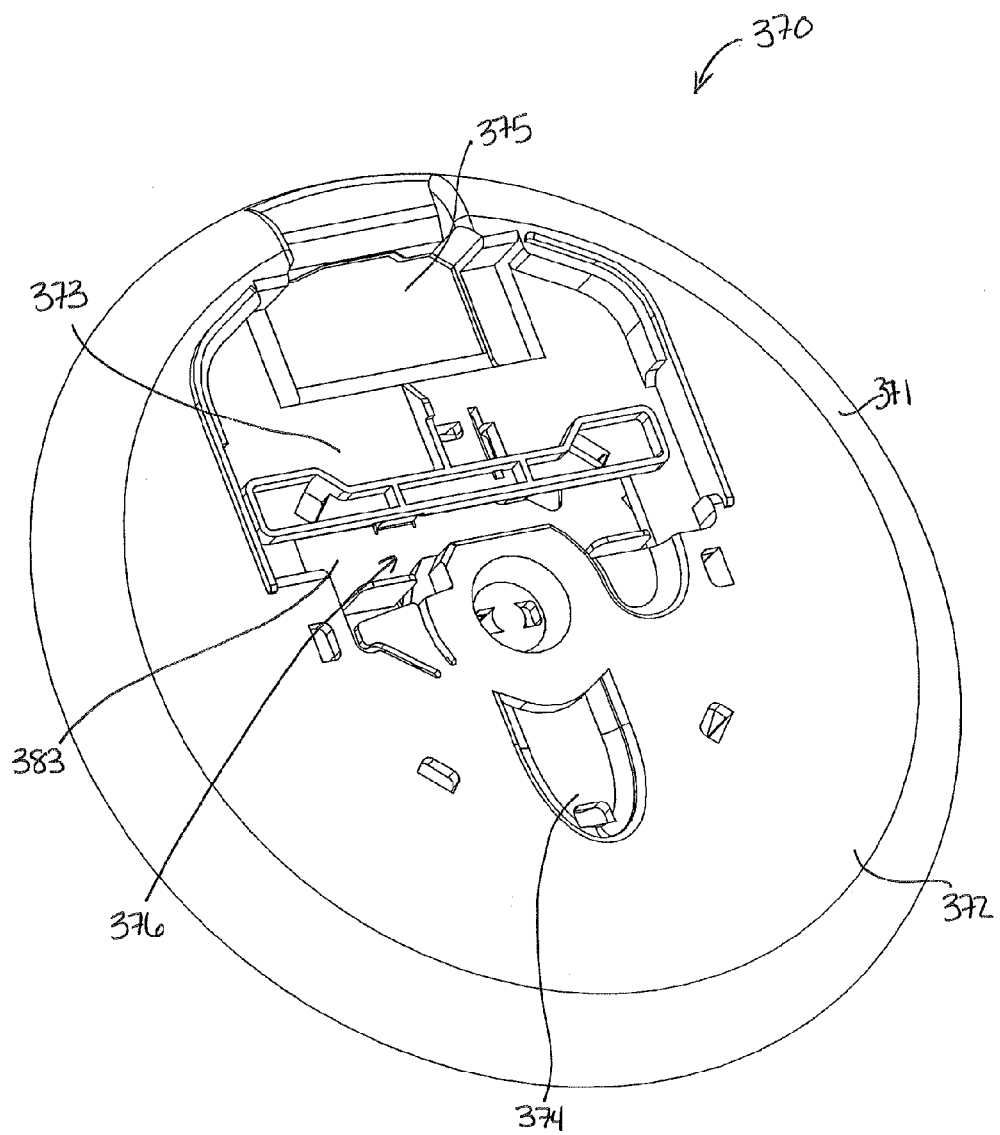
FIG. 26 is a perspective view of a secondary bracket, according to an embodiment.

As shown in FIG. 25, the coupler member 360 can be moved in the direction of the arrows II to place the coupler member 360 in the second position, relative to the base 321. In this manner, the first latch 362 of the first arm 361 and the first latch 365 of the second arm 364 can engage the surface of the base 321 defining the grooves 339 to maintain the coupler member 360 in the second position. Furthermore, when the coupler member 360 is moved to the second position, the space defined between the extension 333 of the base 321 and the extension 367 of the coupler member 360 is reduced (see FIG. 24). In some embodiments, a portion of the secondary bracket can be selectively maintained within the space between the extension 333 of the base 321 and the extension 367 of the coupler member 360. While the coupler member 360 is described as being moved between a first position and a second position relative to the base 321, in some embodiments, the coupler member 360 can be moved to a third position, relative to the base 321. In such embodiments, the second latch 363 (see FIG. 22) of the first arm 361 and the latch protrusion 366 of the second arm 364 engage the surface of the base 321. In this manner, the space between extensions 333 and 367 can be configured to receive any suitable secondary bracket of any suitable size.

Figure 27:
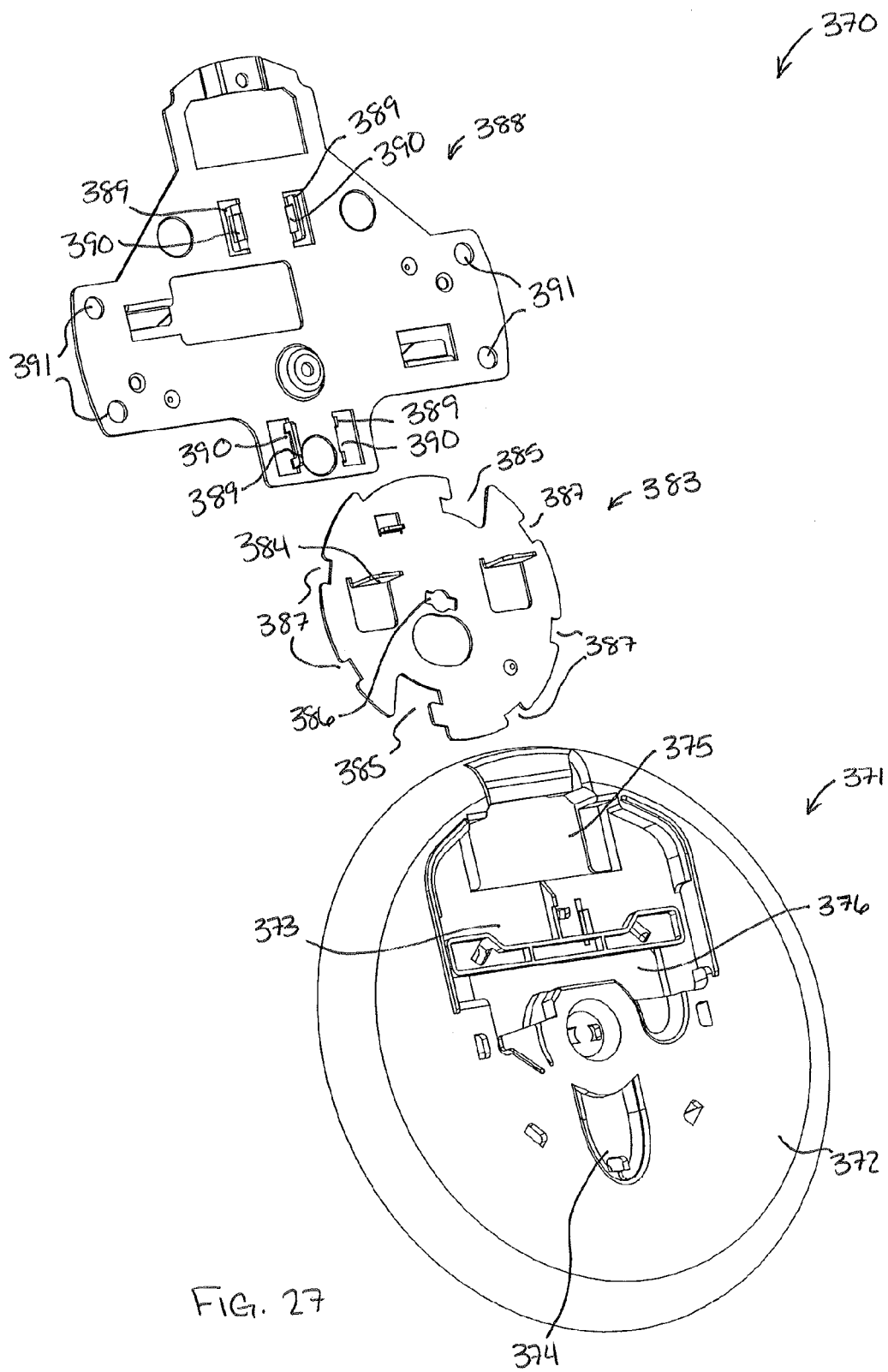
FIG. 27 is an exploded view of the secondary bracket of FIG. 26.

For example, FIGS. 26-33 illustrate a secondary bracket 370, according to an embodiment. As shown in FIG. 27, the secondary bracket 370 includes a first member 371, a second member 383, and a third member 388. The secondary bracket 370 can be any suitable shape, size, or configuration and be formed from any suitable material (e.g., metal, plastic, or a combination thereof). The first member 371 (FIGS. 26 and 27) includes a first side 372, a second side 377, and a coupling portion 373. The coupling portion 373 is configured to be selective engaged by the bracket 320 and defines, at least in part, an opening 375 and a channel 376.

The second member 383 includes a set of tabs 384 and defines a first set of notches 385, a second set of notches 387, and an aperture 386. The second member 383 is configured to be rotatably coupled to the first member 371, as further described herein. The third member 388 includes a set of tabs 389 each defining a slot 390 configured to receive a portion of the second member 383. The third member 388 further defines a set of apertures 391 configured to receive a portion of the first member 371.

Figure 28:
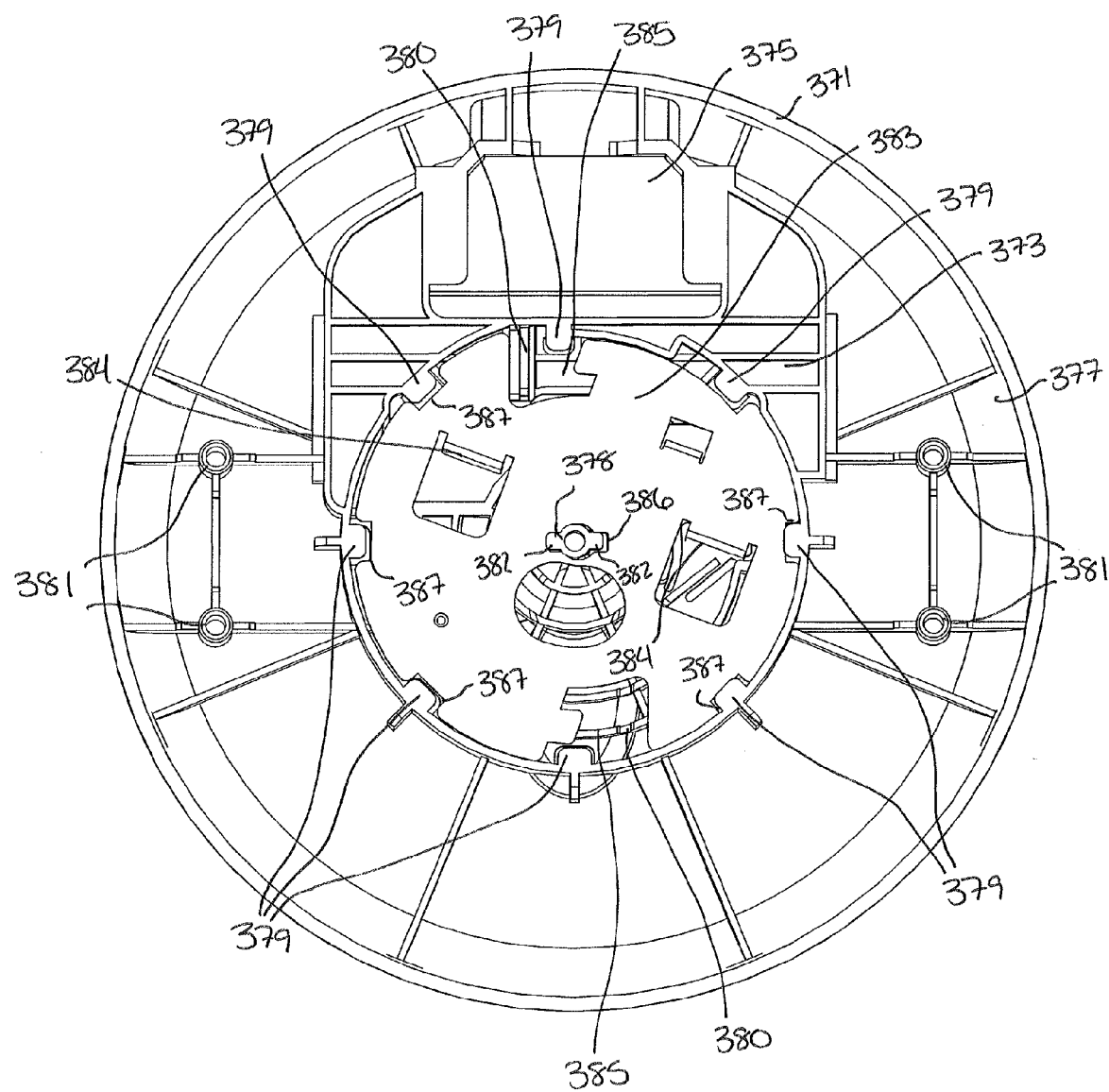
FIG. 28 is a bottom view of a second member of the secondary bracket of FIG. 26 rotatably coupled to a first member of the secondary bracket of FIG. 26.

As described above, the second member 383 is configured to be rotatably coupled to the first member 371. For example, as shown in FIG. 28, the projection 378, extending from the second side 377 of the first member 371, is configured to be disposed within the aperture 386 defined by the second member 383. Expanding further, the projection 378 includes a set of tabs 382 that substantially limit the orientation of the aperture 386 (and thus, the second member 383) relative to the projection 378 (and thus, the first member 371). Similarly stated, the arrangement of the projection 378 and the aperture 386 substantially limits the insertion of the projection 378 through the aperture 386 to a single orientation. In addition, the arrangement of the tabs 379 and the tabs 382 included in the first member 371 and the first set of notches 385, the second set of notches 387, and the aperture 386 of the second member 383 further limit the orientation of the second member 383 relative to the first member 371. Therefore, the second member 383 is placed in contact with the second side 377 of the first member 371 in a first configuration. Moreover, when the second member 383 is in contact with the second side 377 of the first member 371, the tabs 382 and the tabs 379 extend substantially above the second member 383 such that the second member 383 can be rotated relative to the first member 371, as further described herein.

Figure 29:
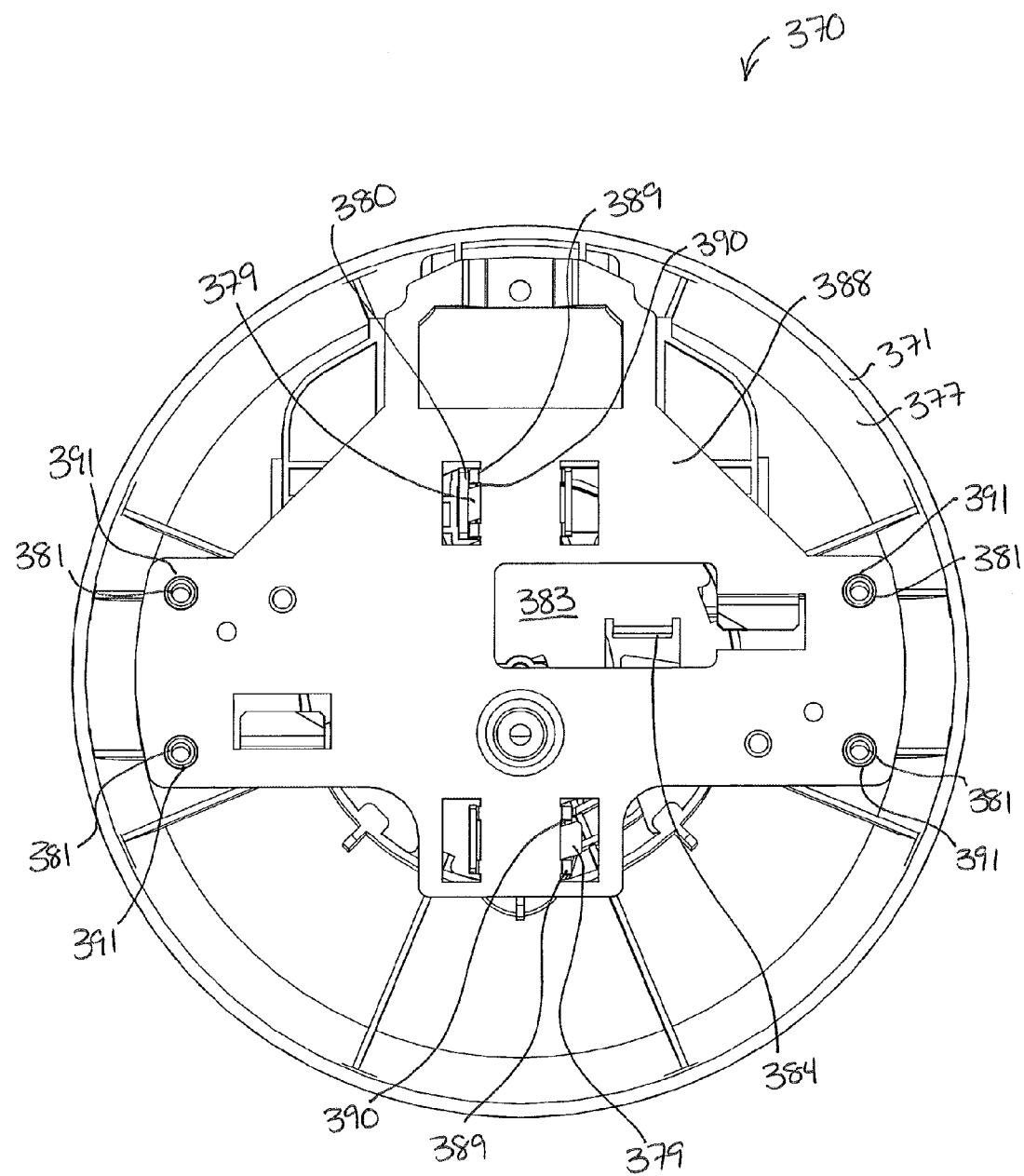
FIG. 29 is a bottom view of a third member of the secondary bracket of FIG. 26 coupled to the first member and the second member illustrated in FIG. 28.
Figure 30:
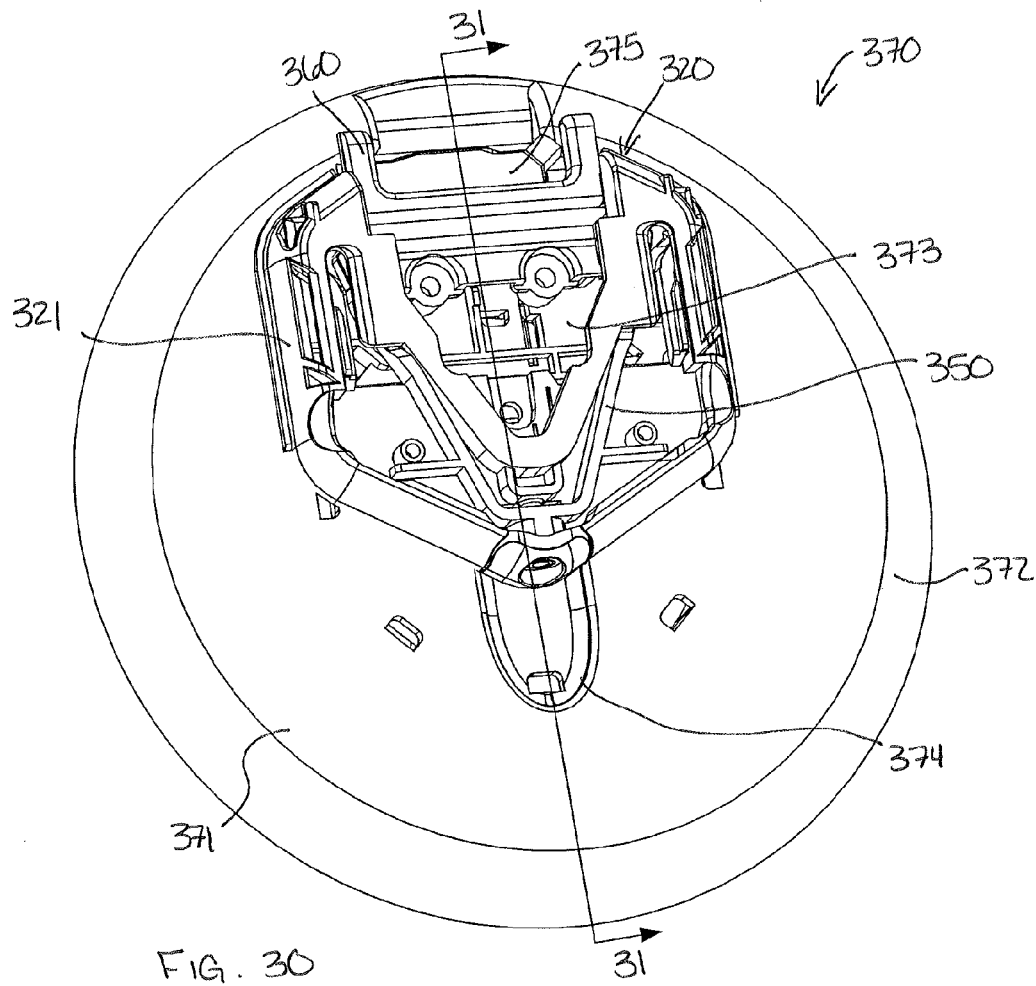
FIG. 30 is a perspective view of the bracket of FIG. 13 mated to the secondary bracket of FIG. 26, in a first configuration.
Figure 31:
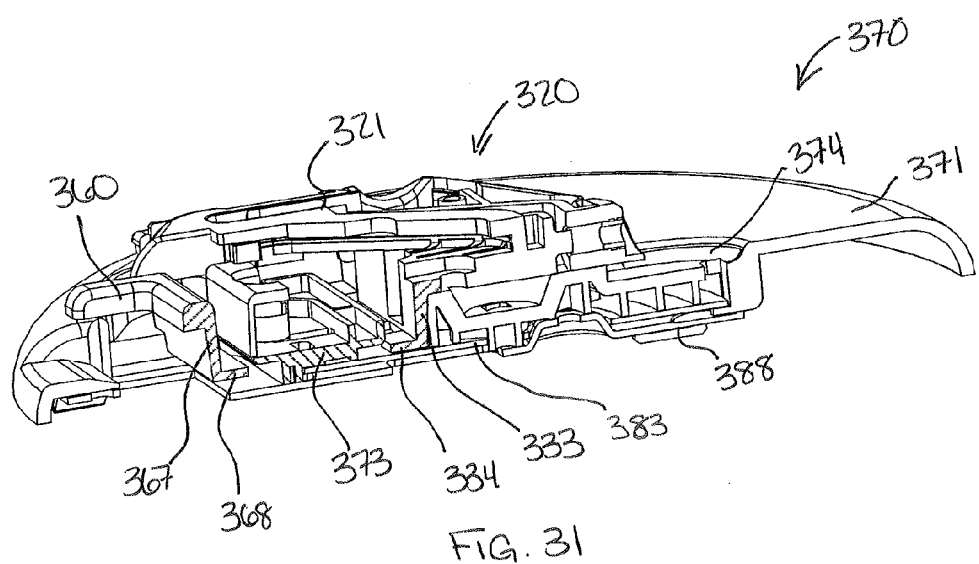
FIG. 31 is a cross-sectional view of the bracket and the secondary bracket taken along the line 31-31 in FIG. 30.

With the second member 383 rotatably mated to the first member 371, the third member 388 can be disposed about the second member 383 (e.g., the third member 388 substantially covers the second member 383), as shown in FIG. 29. In this manner, the second member 383 can be moved to a second configuration, relative to the first member 371. More specifically, a user can engage the tabs 384 of the second member 383 to rotate the second member 383 about the projection 378. The tabs 384 can be configured to contact a portion of the first member 371 to substantially limit the motion of the second member 383, relative the first member 371. For example, when the second member 383 is rotated to the second configuration, the tabs 384 can be placed in contact with the coupling portion 373 of the first member 371 to prevent the rotation of the second member 383 beyond the second configuration. Furthermore, the rotation of the second member 383 can be such that the tabs 379 extend over a portion of the second member 383 (e.g., substantially other than the first set of notches 385 and the second set of notches 387). In this manner, the tabs 379 are configured to maintain, at least partially, the second member 383 in a fixed location relative to the first member 371.

With the third member 388 in contact with a portion of the second member 383 and the first member 371, the rotation of the second member 383 can be such that a portion of the second member 383 engages a portion of the third member 388. More particularly, at least a portion of the tabs 389 of the third member 388 can be disposed within a set of slots 380 defined by the first member 371 (see FIG. 28), and the rotation of second member 383 can be such that a portion of the second member 383 is disposed within the slots 390 defined by the tabs 389. In addition, a portion of the protrusions 381 of the first member 371 can be disposed within the apertures 391 of the third member 388, thereby maintaining the third member 388 in alignment relative to the first member 371. In this manner, the rotation of the second member 383 to the second position can be such that the first member 371, the second member 383, and the third member 388 are temporarily retained when the second member 383 is in the second configuration.

Figure 32:
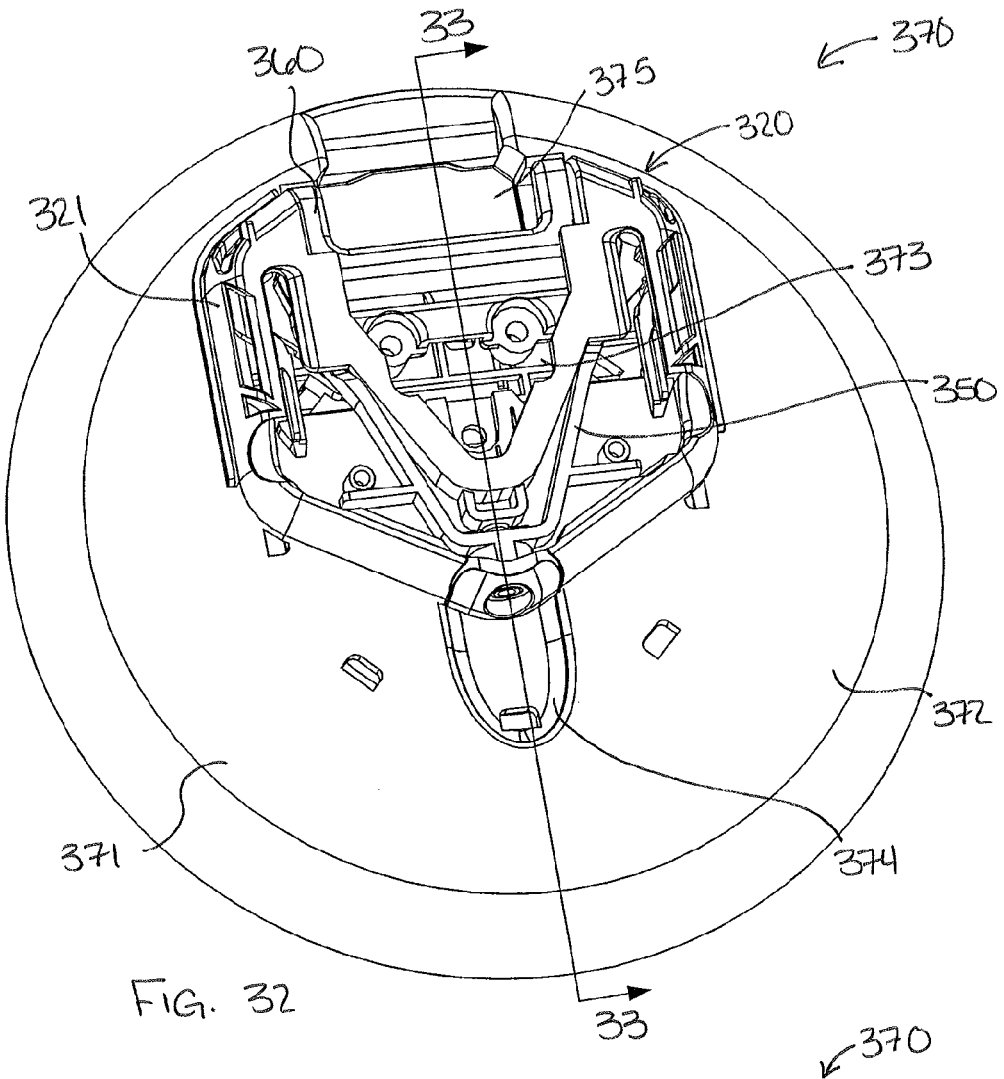
FIG. 32 is a perspective view of the bracket of FIG. 13 mated to the secondary bracket of FIG. 26, in a second configuration.
Figure 33:
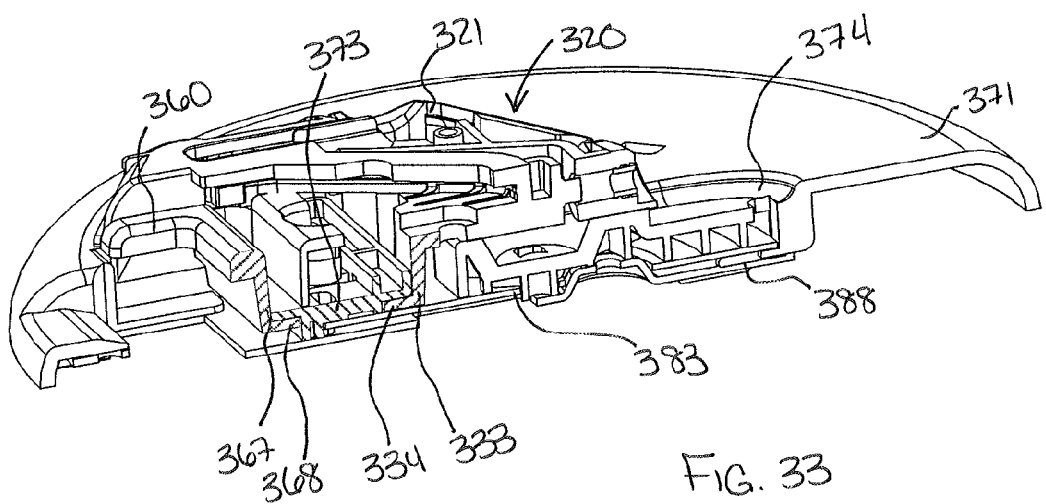
FIG. 33 is a cross-sectional view of the bracket and the secondary bracket taken along the line 33-33 in FIG. 32.

As shown in FIGS. 30-33, the bracket 320 can be configured to be coupled to the secondary bracket 370. More specifically, the bracket 320 is configured to be coupled to the first member 371 of the secondary bracket 370. In this manner, the coupler member 360 of the bracket 320 can be placed in the first position, relative to the base 321 such that the extension 333 of the base 321 and the extension 367 of the coupler member 360 extend through the channel 376 and the opening 375, respectively. As shown in FIGS. 32 and 33, the coupler member 360 can be moved to the second position such that the tabs 334 of the base 321 and the tabs 368 of the coupler member 360 extend about a portion of the coupling portion 373 of the first member 371. Furthermore, the first latch 362 of the first arm 361 and the first latch 365 of the second arm 364 included in the coupler member 360 engage the surface of the base 321 defining the grooves 339 to maintain the coupler member 360 in the second position. In this manner, the bracket 320 can be selectively coupled to the secondary bracket 370.

The coupling of the bracket 320 to the secondary bracket 370 can be such that the bracket 320 substantially maintains the mating of the first member 371, the second member 383, and the third member 388. More specifically, (1) at least a portion of the third member 388 included in the secondary bracket 370 and (2) at least a portion of the bracket 320, substantially encase the second member 383 of the secondary bracket 370. Similarly, (1) at least a portion of the second member 383 and (2) at least a portion of the bracket 320, substantially encase the first member 371. With the third member 388 and the bracket 320 configured to limit the access to the second member 383, the second member 383 is temporarily retained in the second configuration. For example, with the bracket 320 coupled to the first member 371, the extension 333 of the base 321 substantially limits the movement of the tabs 384 of the second member 383 such that the second member 383 is substantially maintained in the second configuration. Therefore, the bracket 320, the first member 371, the second member 383, and the third member 388 remain removably coupled and temporarily retained together while the bracket 320 is coupled to the first member 371.

While not shown in FIGS. 30-33, the housing 300 can be coupled to the bracket 320 when the bracket 320 is coupled to the secondary bracket 370. In this manner, at least a portion of the housing 300 can substantially block access to the bracket 320 such that the bracket 320 cannot be decoupled from the secondary bracket 370 until the housing 300 is decoupled from the bracket 320. Similarly stated, the housing 300 can block access to the coupler member 360 such that the coupler member 360 is maintained in the second position (thereby maintaining the bracket 320 in contact with the secondary bracket 370). Furthermore, as described above, the security member 358 can be disposed within the aperture 357 and in contact with the stop 337 (described above) such that the actuator 350 is maintained in the first configuration. Thus, the first projection 352 and the second projection 354 of the actuator 350 remain within the first notch 305 and the second notch 307, respectively, of the mount projection 301, and the mount projection 301 remains disposed within the opening 328. In this manner, when the security member 358 is disposed within the aperture 357 and in contact with the stop 337, the housing 300, the bracket 320, and the secondary bracket 370 remain coupled together. Similarly stated, in some embodiments, the security member 358 needs to be removed for the housing 300 to be decoupled from the bracket 320 and the housing 300 needs to be removed for the bracket 320 to be decoupled from the secondary bracket 370.

Figure 34:
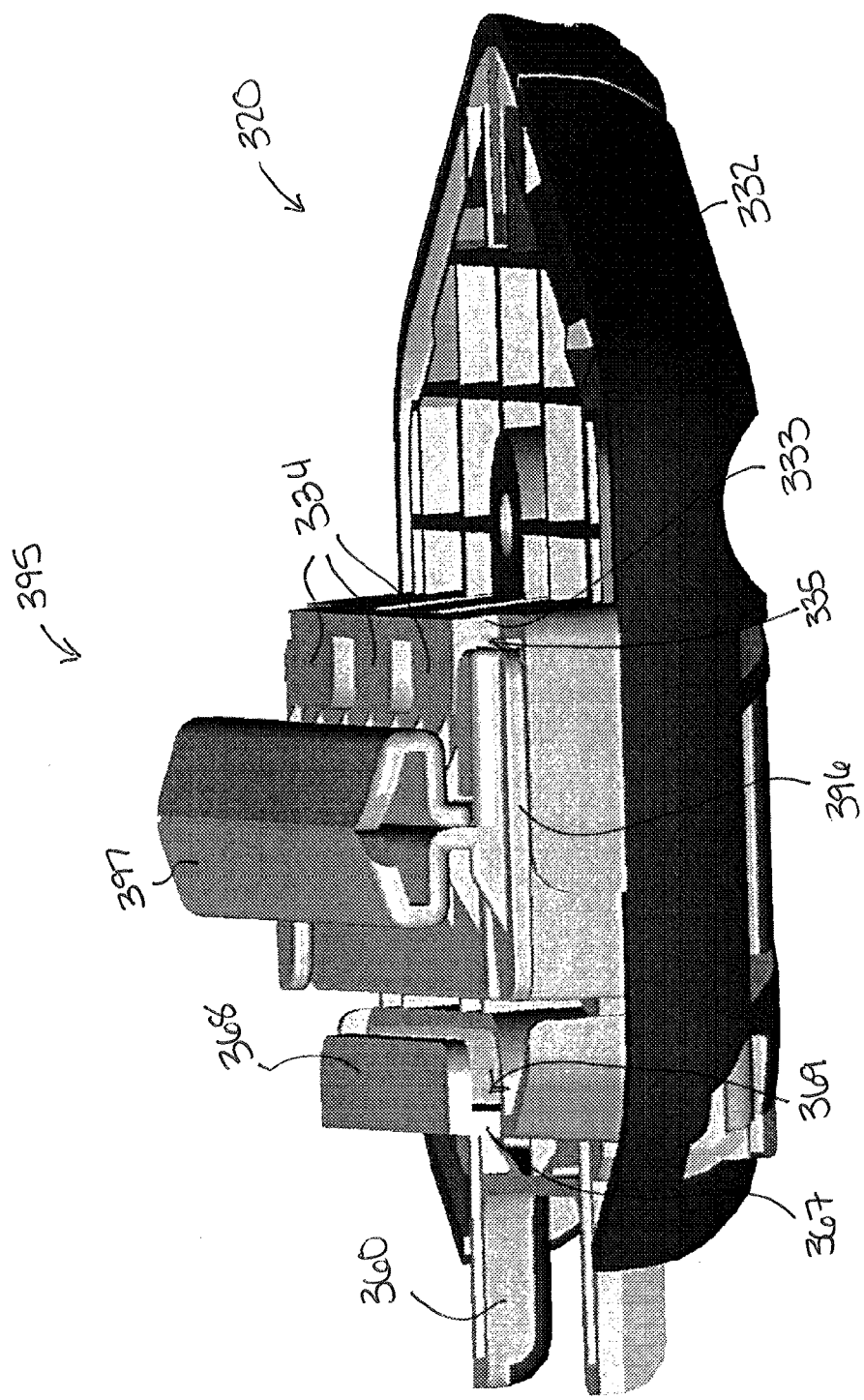
FIG. 34 is a side perspective view of the bracket illustrated in FIG. 13 coupled to a rail adapter, in a first configuration.
Figure 35:
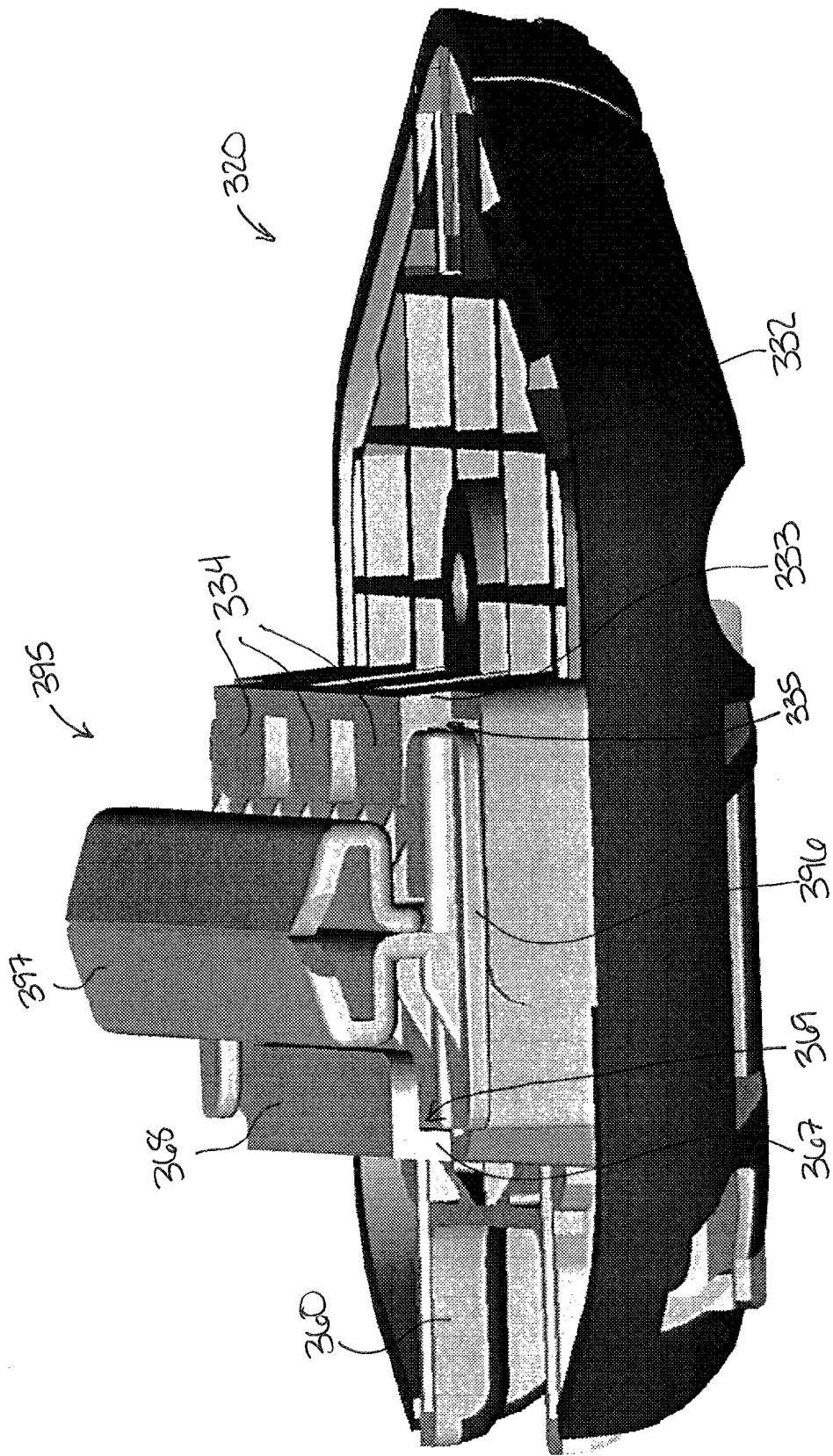
FIG. 35 is a side perspective view of the bracket and the rail adapter illustrated in FIG. 34, in a second configuration.

While the bracket 320 is shown in FIGS. 30-33 to couple to the secondary bracket 370, in some embodiments, the bracket 320 can be coupled to an adapter. The adapter can be any suitable shape, size, or configuration. For example, as shown in FIGS. 34 and 35, an adapter 395 includes a base 396 and a protrusion 397. In some embodiments, the protrusion 397 is configured to mate with, for example, a portion of a ceiling such as a rail. In other embodiments, the protrusion 397 and/or any other suitable portion of the adapter 395 can be configured to mate with any suitable structure (e.g., a wall, a ceiling, a table, a shelf, etc.).

The base 396 of the adapter 395 is configured to engage a portion of the bracket 320. For example, as shown in FIG. 34, the coupler member 360 of the bracket 320 can be in the first configuration such that the space between the extension 333 of the base 321 and the extension 367 of the coupler member 360 is substantially greater than the width of the base 396 of the adapter 395. In this manner, the base 396 can be disposed in the recess 335 of the extension 333. Similarly stated, the base 396 can be placed in contact with the bracket 320 such that the tabs 334 of the extension 333 extend about a portion of the base 396.

As shown in FIG. 35, the coupler member 360 can be moved to the second configuration such that a portion of the base 396 of the adapter 395 is disposed within the recess 369 of the extension 367. In this manner, the tabs 368 of the extension 367 extend about a portion of the base 396. Therefore, with the coupler member 360 in the second position, the tabs 334 of the extension 333 and the tabs 368 of the extension 367 maintain the adapter 395 within the recess 335 of the base 321 and the recess 369 of the coupler member 360, respectively.

Figure 36:
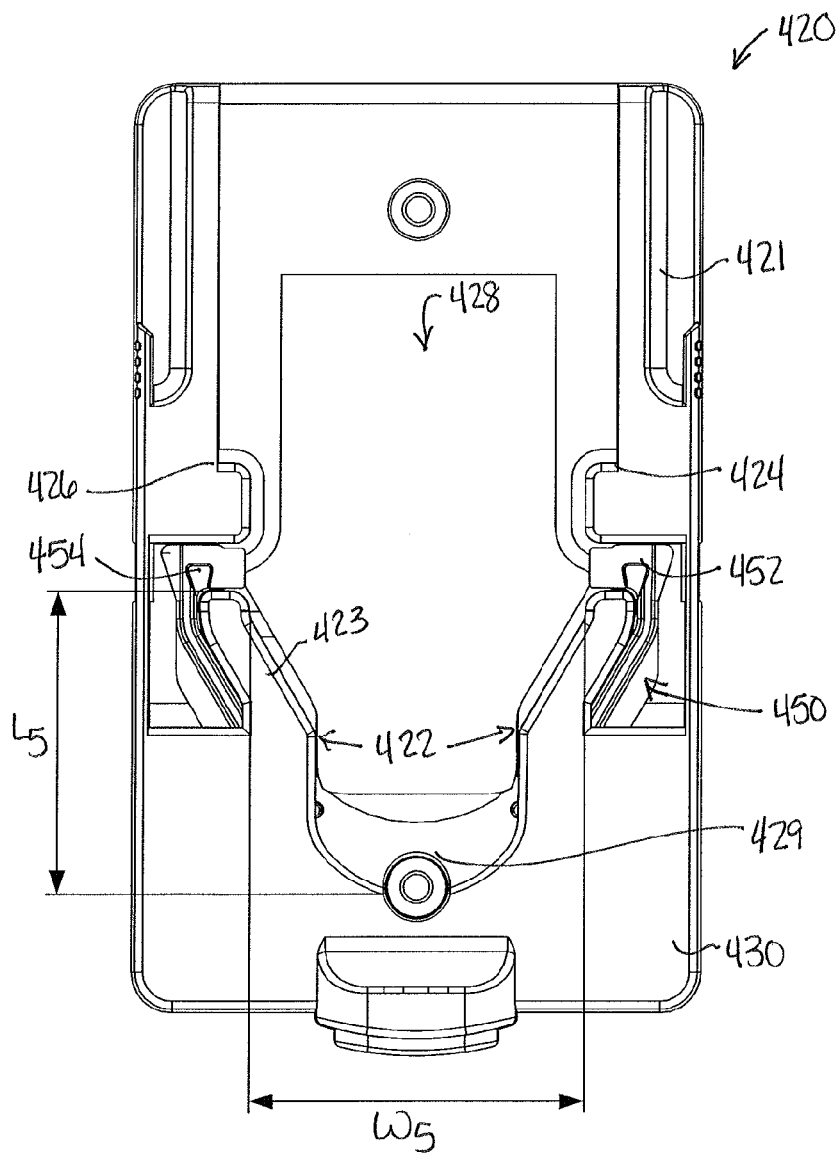
FIG. 36 is a top view of a bracket, according to an embodiment.
Figure 37:
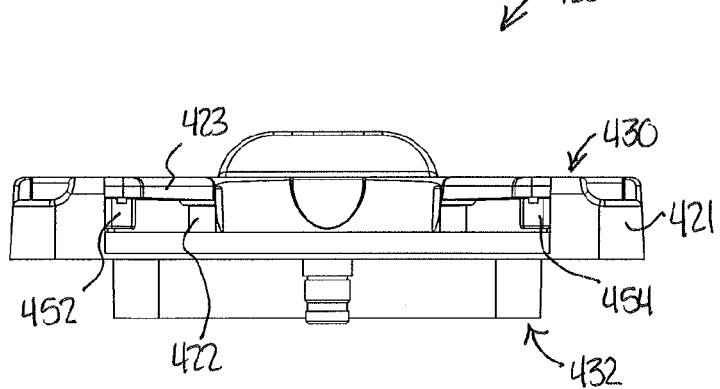
FIG. 37 is a front view of the bracket illustrated in FIG. 36.

While the bracket 320 is described above, with reference to FIGS. 13-35, as having a particular shape and/or features, in some embodiments, a bracket can be any suitable bracket configured to be coupled to the mount projection 301 of the housing 300. For example, FIGS. 36-42, illustrate a bracket 420 that includes a base 421 and an actuator 450. The base 421 can be any suitable shape, size, or configuration. For example, as shown in FIG. 36, the base 421 can be substantially rectangular.

Figure 39:
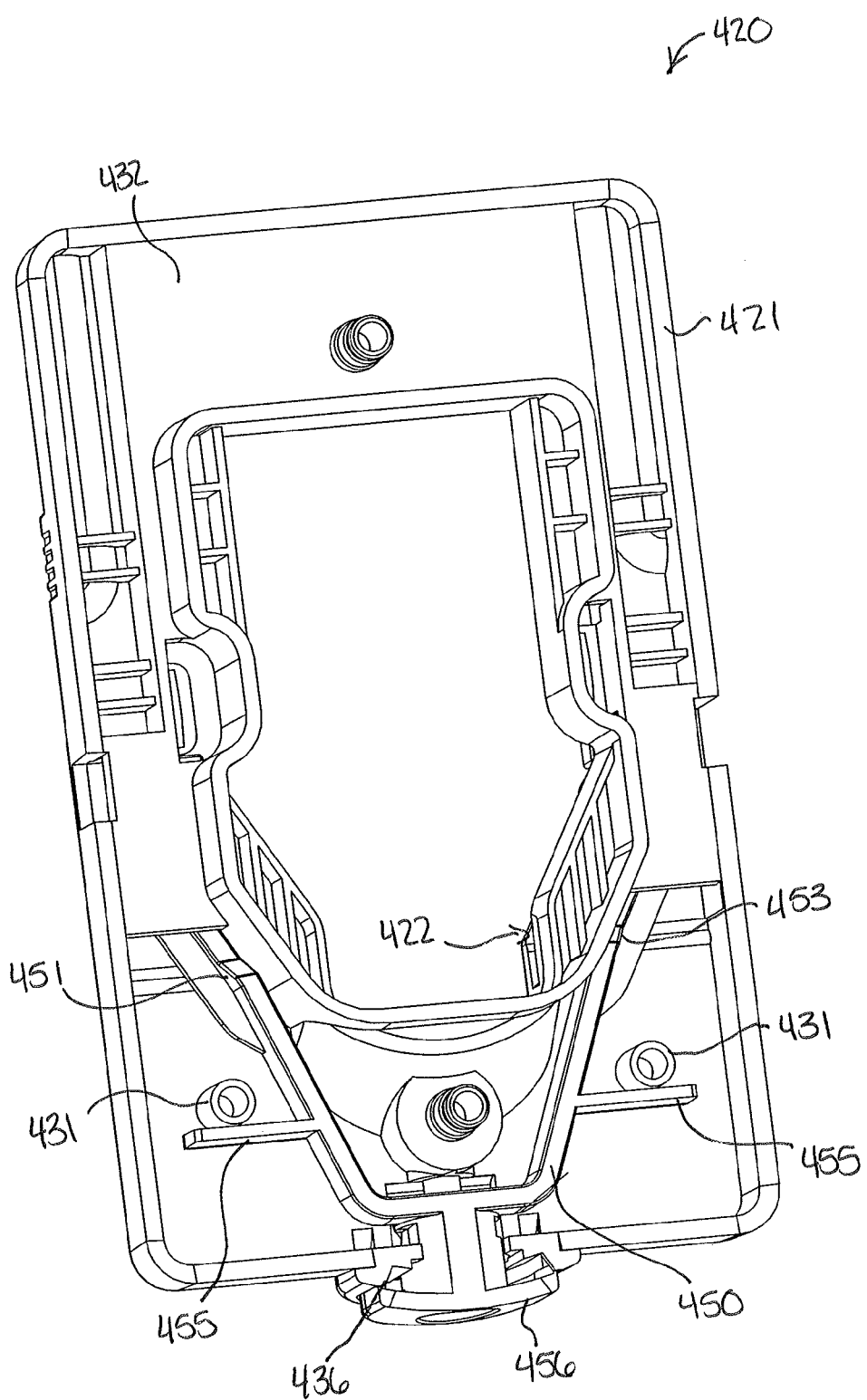
FIG. 39 is a bottom perspective view of the bracket illustrated in FIG. 36.
Figure 42:
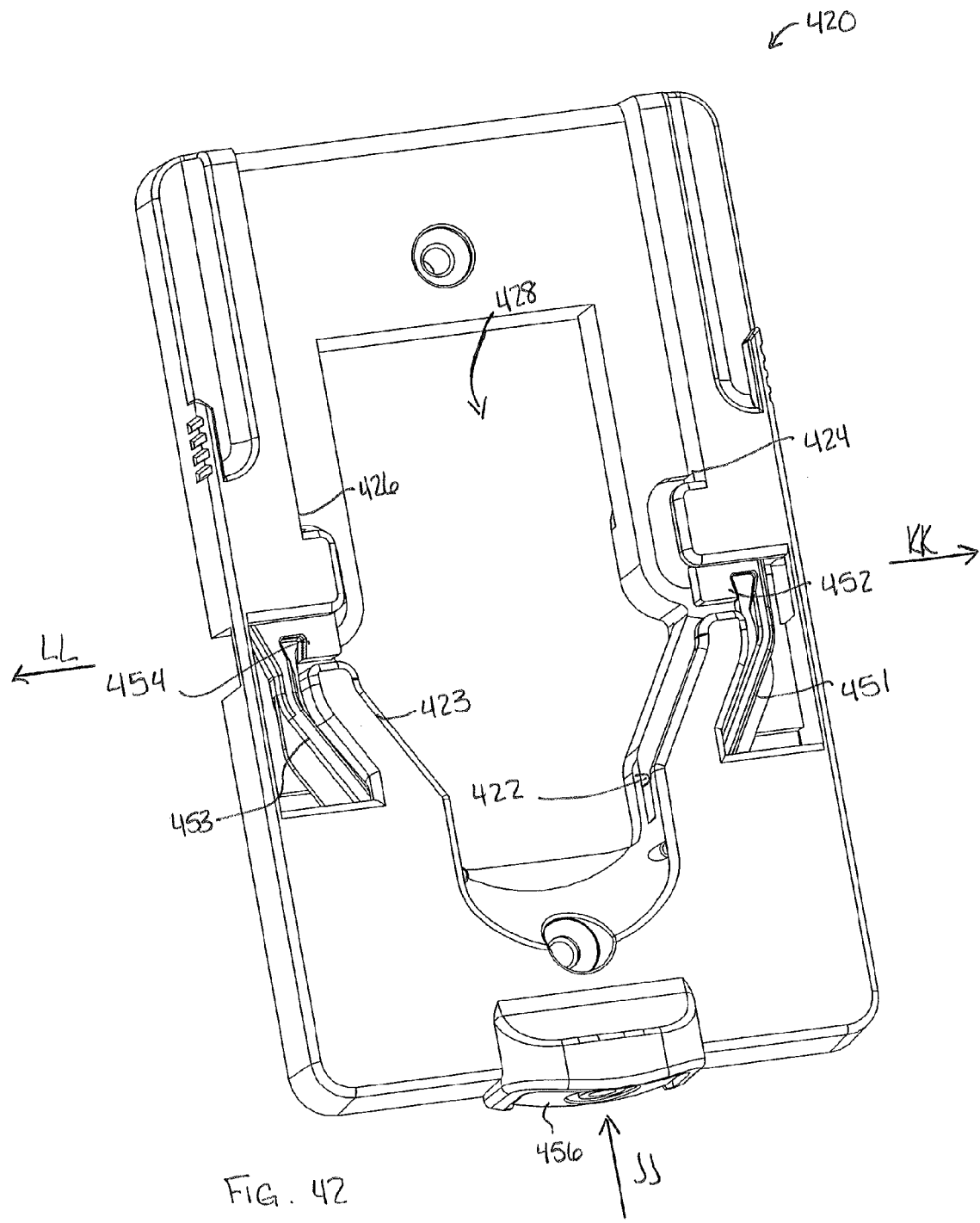
FIG. 42 is a perspective view of the bracket illustrated in FIG. 36, in a second configuration.

The base 421 includes a top surface 430 (e.g., FIG. 36) and a bottom surface 432 (e.g., FIG. 39). The top surface 430 defines a recessed wall 422. More specifically, the recessed wall 422 includes a lip 423 such that the recessed wall 422 and the lip 423 define an opening 428 configured to receive at least a portion of the mount projection 301 of the housing 300 (FIG. 42). The bottom surface 432 includes a set of protrusions 431 configured to engage a portion of the actuator 450, as described in further detail herein.

The recessed wall 422 includes a first end portion 424, a second end portion 426, and a leading portion 429. More specifically, the recessed wall 422 has a maximum width $W_5$ defined between a point of the first end portion 424 and a point of the second end portion 426 and a length $L_5$ between the leading portion 429 and a line (not shown) associated with the maximum width $W_5$. In this manner, the recessed wall 422 is configured to extend, substantially continuously, between the first end portion 424 and the second end portion 426 such that at least a portion of the recessed wall 422 defines a substantially conical cross-sectional shape. Furthermore, the width $W_5$ and the length $L_5$ of the recessed wall 422 are configured to substantially correspond to the width $W_3$ and the length $L_3$ of the mount projection 301, as further described herein. The recessed wall 422 defines a set of notches 438 and an actuator channel 436 configured to receive a portion of the actuator 450, as further described herein.

Figure 38:
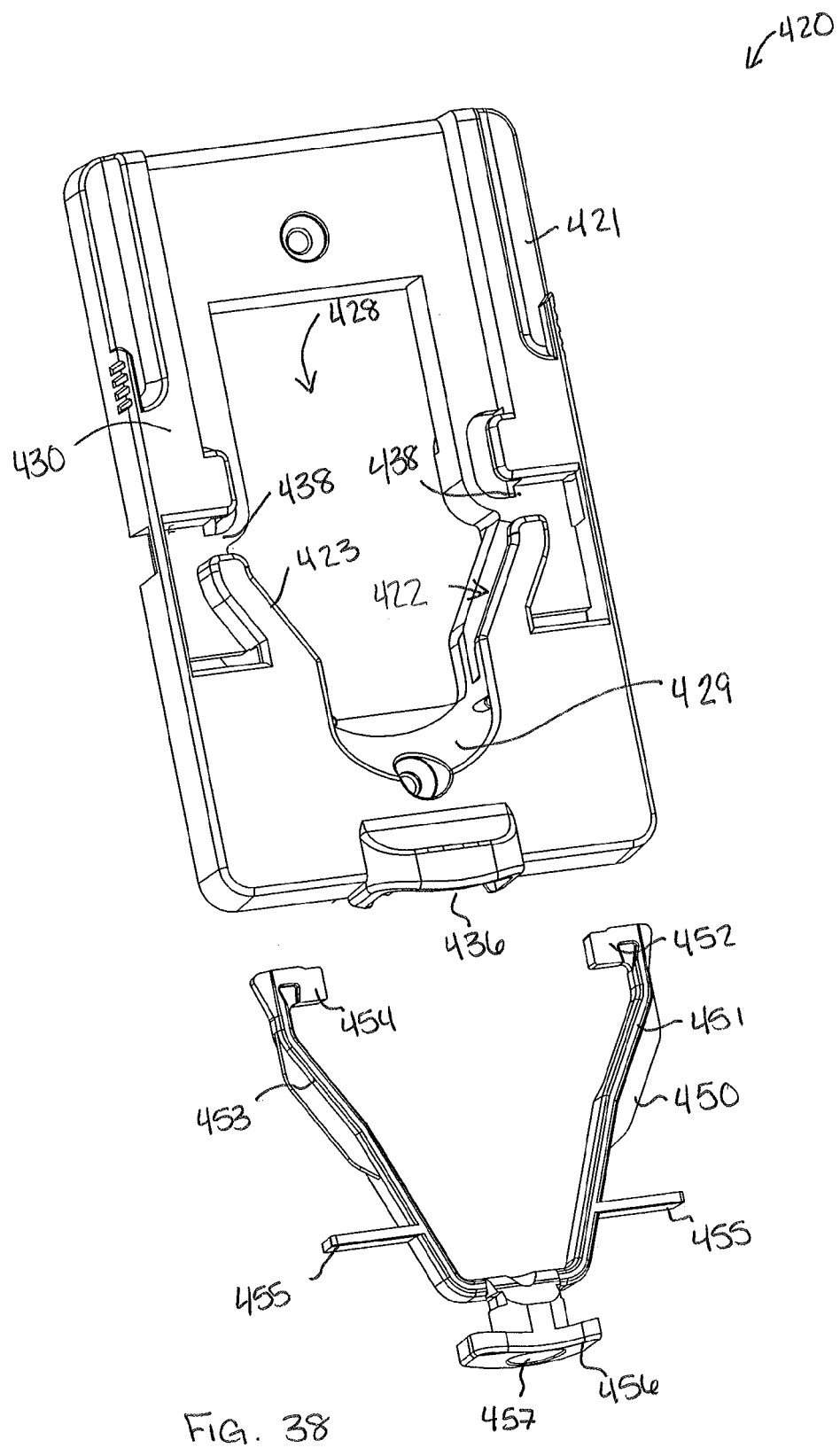
FIG. 38 is an exploded view of the bracket illustrated in FIG. 36.

The actuator 450 can be any suitable shape, size, or configuration. For example, as shown in FIG. 38, the actuator 450 can have a substantially wishbone shape (e.g., forked or otherwise bifurcated). The actuator 450 includes a first end portion 451, a second end portion 453, and an engagement portion 456 and is configured to be moved between a first configuration and a second configuration. The first end portion 451 and the second end portion 453 include a first projection 452 and a second projection 454, respectively. The actuator 450 further includes a set of extension 455 configured to protrude from a portion of the actuator 450. In use, the extensions 455 are configured to engage the protrusions 431 of the base 421 when the actuator 450 is moved between the first configuration and the second configuration, as described above with respect to FIG. 22. The engagement portion 456 includes an aperture 457 configured to receive a security member (not shown in FIGS. 36-41). The security member can be configured to contact a portion of the base 421 to limit the movement of the actuator 450 relative to the base 421. In some embodiments, the actuator 450 can be substantially similar in form and function to the actuator 350, described above with reference to FIGS. 13-25. In this manner, portions of the actuator 450 and or functions of the actuator 450 are not described in further detail herein.

Figure 40:
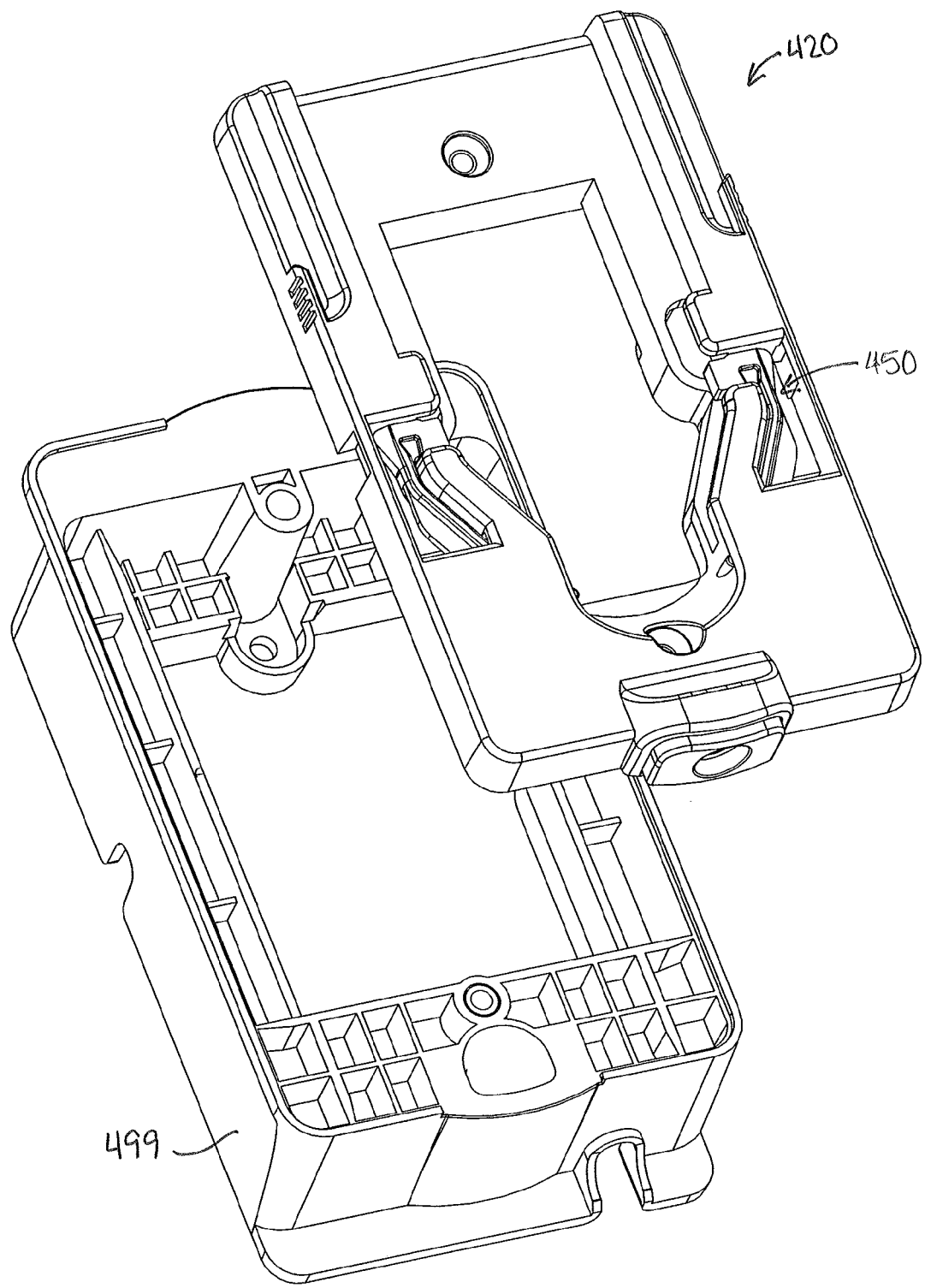
FIG. 40 is an exploded view of the bracket illustrated in FIG. 36 and a known receptacle.
Figure 41:
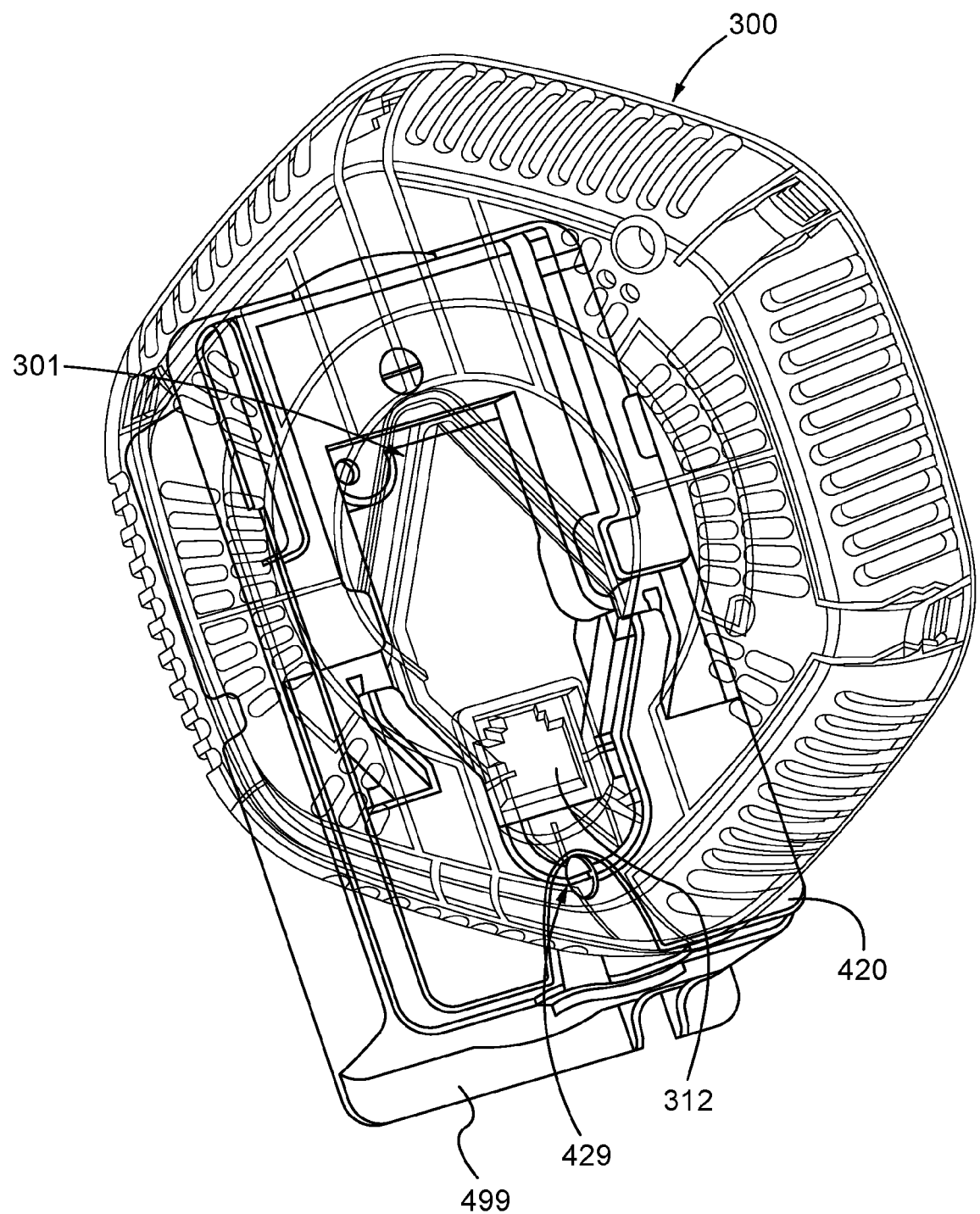
FIG. 41 is a perspective view of the bracket and the receptacle of FIG. 40 coupled to the housing of FIG. 10.

In some embodiments, the bracket 420 can be configured to be coupled to a receptacle 499 (FIGS. 40 and 41). The receptacle 499 can be any suitable receptacle. In some embodiments, the receptacle 499 is a known receptacle configured to mount to, for example, a wall and receive a portion of a wire (e.g., a CAT 5 cable, fiber optic cable, or the like). Therefore, the receptacle 499 is not described in detail herein.

As shown in FIG. 41, the bracket 420 can receive the mount projection 301 of the housing 300 such that the jack port 312 is substantially unobstructed. For example, while shown as being disposed such that the jack port 312 is disposed substantially adjacent the leading portion 429 of the recessed wall 422, in other embodiments, the mount projection 301 can be disposed within the opening 428 as shown above in FIGS. 21 and 22. In this manner, the first projection 352 and the second projection 354 of the actuator 350 are disposed within the first notch 305 and the second notch 307 (respectively) of the mount protrusion 301 to maintain the mount projection 301 within the opening 428 of the bracket 420. Thus, the housing 300 can be coupled to the bracket 420.

The actuator 450 can be moved to the second configuration to decouple the housing 300 from the bracket 420. For example, as shown in FIG. 42, the engagement portion 456 can be moved in the direction of the arrow JJ, to place the actuator 450 in the second configuration. Furthermore, the movement of the engagement portion 456 in the direction of the arrow JJ is such that the first projection 452 moves in the direction of the arrow KK and the second projection 454 moves in the direction of the arrow LL. Therefore, the movement of the first projection 452 in the KK direction and the movement of the second projection 454 in the LL direction substantially removes the first projection 452 and the second projection 454 from the notch 405 and the notch 407, respectively. Thus, the housing 300 can be decoupled from the bracket 420 in a substantially similar manner as the bracket 320, described above with respect to FIG. 22.

Figure 43:
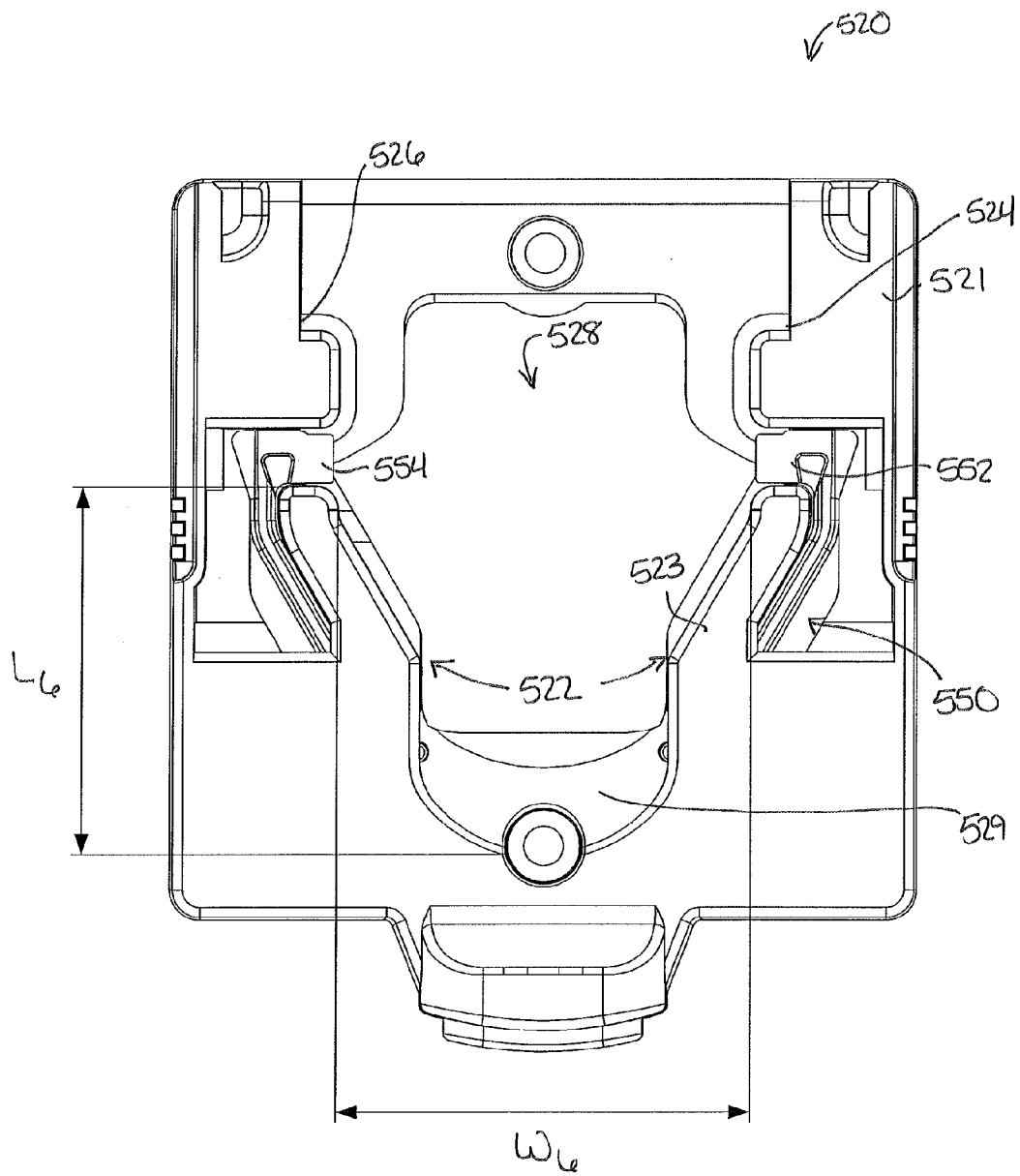
FIG. 43 is a top view of a bracket, according to an embodiment.

While the bracket 420 is described above, with reference to FIGS. 36-42, as being substantially rectangular, in some embodiments, a bracket can be any suitable shape. For example, FIG. 43 illustrates a bracket 520 that includes a base 521 and an actuator 550 that is substantially square. The base 521 defines a recessed wall 522. More specifically, the recessed wall 522 includes a lip 523 such that the recessed wall 522 and the lip define an opening 528 configured to receive at least a portion of the mount projection 301 of the housing 300 (not shown in FIG. 43).

The recessed wall 522 includes a first end portion 524, a second end portion 526, and a leading portion 529. More specifically, the recessed wall 522 has a maximum width $W_6$ defined between a point of the first end portion 424 and a point of the second end portion 426 and a length $L_6$ between the leading portion 429 and a line (not shown) associated with the maximum width $W_6$. In this manner, the recessed wall 522 is configured to extend, substantially continuously, between the first end portion 524 and the second end portion 526 such that at least a portion of the recessed wall 522 defines a substantially conical cross-sectional shape. Furthermore, the width $W_6$ and the length $L_6$ of the recessed wall 522 are configured to substantially correspond to the width $W_3$ and the length $L_3$ of the mount projection 301, as further described above. The recessed wall 522 is further configured to selectively receive a portion of the actuator 550 as further described herein.

The actuator 550 can be any suitable shape, size, or configuration. For example, in some embodiments, the actuator 550 can be substantially similar in form and function as the actuator 450, described above with reference to FIGS. 36-42. Therefore, portions of the actuator 550 are not described in further detail herein.

As described above, the bracket 520 can be configured to receive the mount projection 301 of the housing 300 (not shown in FIG. 43) to couple the housing 300 to the bracket 520. In this manner, a first projection 552 and a second projection 554 of the actuator 550 can be disposed within the first notch 305 and the second notch 307 (respectively) of the mount projection 301 to releasably retain the mount projection 301 within the opening 528 defined by the bracket. In this manner, the bracket 520 can couple the housing 300 in a substantially similar manner as the bracket 420 described above with reference to FIGS. 36-42. Thus, the method of coupling the housing 300 to the bracket 520 is not described in further detail herein.

While various embodiments have been described above, it should be understood that they have been presented by way of example only, and not limitation. Where methods described above indicate certain events occurring in certain order, the ordering of certain events may be modified. Additionally, certain of the events may be performed concurrently in a parallel process when possible, as well as performed sequentially as described above Where schematics and/or embodiments described above indicate certain components arranged in certain orientations or positions, the arrangement of components may be modified. Similarly, where methods and/or events described above indicate certain events and/or procedures occurring in certain order, the ordering of certain events and/or procedures may be modified. While the embodiments have been particularly shown and described, it will be understood that various changes in form and details may be made.

Although various embodiments have been described as having particular features and/or combinations of components, other embodiments are possible having a combination of any features and/or components from any of embodiments as discussed above.

What is claimed is:
1. An apparatus, comprising:
a housing having a mount projection defining a first notch and a second notch; and
a bracket including a base and an actuator,
the base including a top surface and a bottom surface, the top surface defining an opening configured to receive at least a portion of the mount projection, the bottom surface including a set of protrusions configured to engage a portion of the actuator, a portion of the top surface defining an actuator channel configured to receive a first portion of the actuator,
the actuator including a first end portion and a second end portion, and configured to be moved between a first configuration and a second configuration, the first end portion of the actuator including a first projection, and the second end portion of the actuator including a second projection, the actuator further including a set of extensions protruding from a second portion of the actuator and configured to engage the set of protrusions of the bottom surface of the base when the actuator is moved between the first configuration and the second configuration,
in the first configuration, the first projection is disposed within the first notch and the second projection is disposed within the second notch to maintain the mount projection within the opening of the base, the actuator configured to be moved from the first configuration to the second configuration such that the first projection is moved in a first direction and substantially removed from the first notch and the second projection is moved in a second direction and substantially removed from the second notch, the first direction being different from the second direction, the first end portion of the actuator and the second end portion of the actuator configured to deform as the actuator is moved from the first configuration to the second configuration at least in part in response to the engagement between the set of extensions of the actuator and the set of protrusions of the base.

2. The apparatus of claim 1, wherein the first end portion of the actuator and the second end portion of the actuator are monolithically constructed.

3. The apparatus of claim 1, wherein the set of extensions include a first extension and a second extension, the first extension extends from the first end portion of the actuator, and the second extension extends from the second end portion of the actuator.

4. The apparatus of claim 1, wherein:
the set of extensions include a first extension and a second extension,
the first extension extends from the first end portion of the actuator in a third direction,
the second extension extending from the second end portion of the actuator in a fourth direction substantially opposite the third direction.

5. The apparatus of claim 1, wherein the actuator defines an aperture configured to receive a security member such that the security member contacts a portion of the base to limit movement of the actuator relative to the base.

6. The apparatus of claim 1, wherein:
the actuator defines an aperture configured to receive a security member such that the security member contacts a portion of the base to limit movement of the actuator relative to the base,
the security member is configured to be engaged and disengaged with the aperture of the actuator via rotation of the security member.

7. The apparatus of claim 1, wherein the bracket is configured to be coupled to a receptacle, the receptacle being configured to receive a portion of a wire.

8. The apparatus of claim 1, wherein:
the mount projection includes a jack portion defining a port configured to receive a connector to operatively connect components disposed within the housing to components disposed substantially outside the housing,
in the first configuration in which the mount projection is disposed within the opening of the base, the port is unobstructed from receiving the connector.

9. The apparatus of claim 1, wherein the set of extensions are configured to deform as the actuator is moved from the first configuration to the second configuration at least in part in response to engagement between the set of extensions of the actuator and the set of protrusions of the base.

10. The apparatus of claim 1, wherein:
in the first configuration, the first projection is spaced apart from the second projection by a first distance,
in the second configuration, the first projection is spaced apart from the second projection by a second distance greater than the first distance.

11. An apparatus, comprising:
a bracket including a base and an actuator,
the base including a top surface and a bottom surface, the top surface defining an opening configured to receive at least a portion of a mount projection of a housing that is formed separately from the bracket and that defines a first notch and a second notch, the bottom surface of the base including a set of protrusions configured to engage a first portion of the actuator,
the actuator including a first end portion and a second end portion, and configured to be moved between a first configuration and a second configuration, the first end portion of the actuator including a first projection, and the second end portion of the actuator including a second projection, the actuator further including a set of extensions protruding from a second portion of the actuator and configured to engage the set of protrusions of the bottom surface of the base when the actuator is moved between the first configuration and the second configuration,
in the first configuration, the first projection is disposed within the first notch and the second projection is disposed within the second notch to maintain the mount projection within the opening of the base, the actuator configured to be moved from the first configuration to the second configuration such that the first projection is moved in a first direction and substantially removed from the first notch and the second projection is moved in a second direction and substantially removed from the second notch, the first direction being different from the second direction, the first end portion of the actuator and the second end portion of the actuator configured to deflect laterally outwardly relative to a longitudinal centerline axis of the actuator when the actuator is moved from the first configuration to the second configuration.

12. The apparatus of claim 11, wherein the first end portion of the actuator and the second end portion of the actuator are monolithically constructed.

13. The apparatus of claim 11, wherein the set of extensions include a first extension and a second extension, the first extension extends from the first end portion of the actuator, the second extension extends from the second end portion of the actuator.

14. The apparatus of claim 11, wherein:
the set of extensions include a first extension and a second extension,
the first extension extends from the first end portion of the actuator in a third direction,
the second extension extends from the second end portion of the actuator in a fourth direction substantially opposite the third direction.

15. The apparatus of claim 11, wherein the actuator defines an aperture configured to receive a security member such that the security member contacts a portion of the base to limit movement of the actuator relative to the base.

16. The apparatus of claim 11, wherein:
the actuator defines an aperture configured to receive a security member such that the security member contacts a portion of the base to limit movement of the actuator relative to the base,
the security member is configured to be engaged and disengaged with the aperture of the actuator via rotation of the security member.

17. The apparatus of claim 11, wherein the set of extensions are configured to deform as the actuator is moved from the first configuration to the second configuration at least in part in response to engagement between the set of extensions of the actuator and the set of protrusions of the base.

18. The apparatus of claim 11, wherein:
in the first configuration, the first projection is spaced apart from the second projection by a first distance,
in the second configuration, the first projection is spaced apart from the second projection by a second distance greater than the first distance.

19. The apparatus of claim 11, wherein the first end portion of the actuator and the second end portion of the actuator are configured to deform as the actuator is moved from the first configuration to the second configuration at least in part in response to the engagement between the set of extensions of the actuator and the set of protrusions of the base.

* * * * *